United States Patent
Tanaka

(10) Patent No.: US 7,579,246 B2
(45) Date of Patent: Aug. 25, 2009

(54) SEMICONDUCTOR DEVICE MANUFACTURING METHOD INCLUDING OBLIQUE ION IMPLANTATION PROCESS AND RETICLE PATTERN FORMING METHOD

(75) Inventor: Takuji Tanaka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 137 days.

(21) Appl. No.: 11/524,945

(22) Filed: Sep. 22, 2006

(65) Prior Publication Data
US 2007/0224755 A1    Sep. 27, 2007

(30) Foreign Application Priority Data
Mar. 22, 2006    (JP)    ............................. 2006-079227

(51) Int. Cl.
    *H01L 21/4763*    (2006.01)
(52) U.S. Cl. ..................... 438/286; 438/302; 438/303; 438/305; 438/525; 257/E21.411; 257/E21.416; 257/E21.422; 257/E21.626; 257/E21.682; 257/E29.268; 257/E29.286; 257/E29.287; 257/E29.306
(58) Field of Classification Search ................. 438/199, 438/267, 268, 286, 302, 303, 305, 525; 257/E21.411, 257/416, 525, 626, 646, E29.268, 286, 287, 257/306
    See application file for complete search history.

(56) References Cited

U.S. PATENT DOCUMENTS

| | | | | |
|---|---|---|---|---|
| 5,190,887 A * | 3/1993 | Tang et al. | ................... | 438/264 |
| 5,223,445 A * | 6/1993 | Fuse | ........................... | 438/302 |
| 5,605,849 A * | 2/1997 | Chen et al. | ................... | 438/345 |
| 5,923,969 A * | 7/1999 | Oyamatsu | ..................... | 438/183 |
| 5,933,733 A * | 8/1999 | Ferla et al. | ................... | 438/268 |
| 6,008,094 A * | 12/1999 | Krivokapic et al. | ......... | 438/286 |
| 6,083,794 A * | 7/2000 | Hook et al. | ................. | 438/286 |
| 6,566,204 B1 * | 5/2003 | Wang et al. | ................. | 438/286 |
| 6,794,256 B1 * | 9/2004 | Fuselier et al. | ............. | 438/286 |
| 6,806,128 B2 * | 10/2004 | Ootsuka et al. | ............ | 438/199 |
| 6,943,098 B2 * | 9/2005 | Yeh et al. | .................... | 438/525 |
| 2004/0014303 A1 * | 1/2004 | Layman et al. | ............. | 438/525 |

FOREIGN PATENT DOCUMENTS

JP    08-279612 A    10/1996

* cited by examiner

*Primary Examiner*—Michael S Lebentritt
(74) *Attorney, Agent, or Firm*—Fujitsu Patent Center

(57) ABSTRACT

An active region and an opposite conductivity active region are formed in a semiconductor substrate. The opposite conductivity active region is covered with a resist pattern. Impurities are implanted into a surface layer of the active region. An angle $\theta_0$ is defined as a tilt angle obtained by tilting a virtual plane perpendicular to the substrate and including an edge of the active region, toward the resist pattern by using as a fulcrum a point on the substrate nearest to the resist pattern, until the virtual plane contacts the resist pattern. The ion implantation is performed in a direction having a tilt angle larger than $\theta_0$ and allowing ions passed through the uppermost edge of the resist pattern to be incident upon an area between the resist pattern and the active region, and is not performed along a direction allowing the ions to be incident upon the active region.

11 Claims, 18 Drawing Sheets

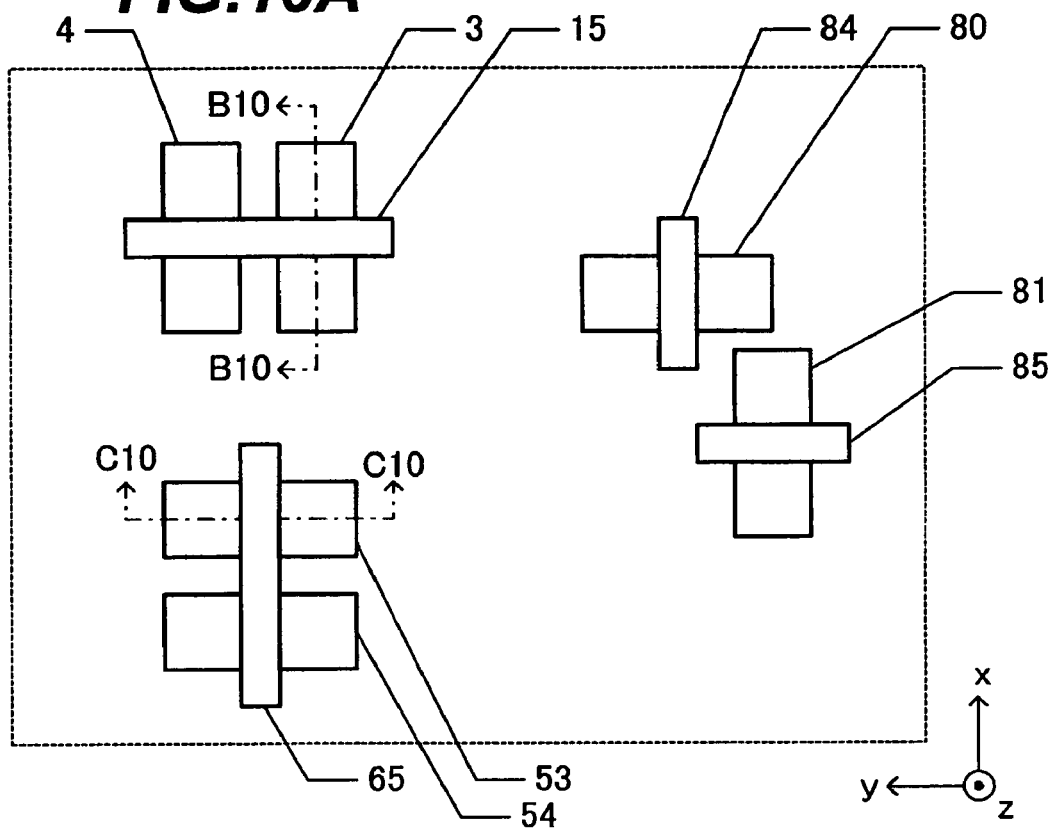
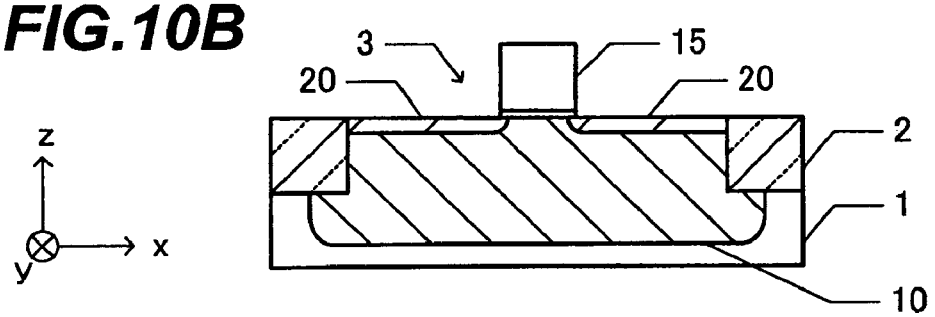
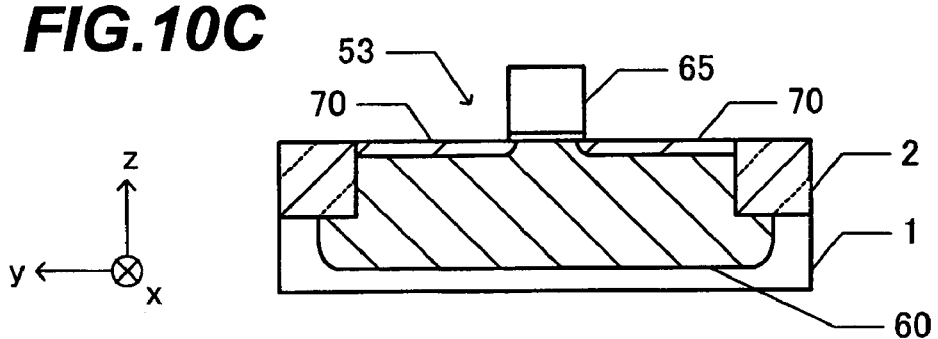

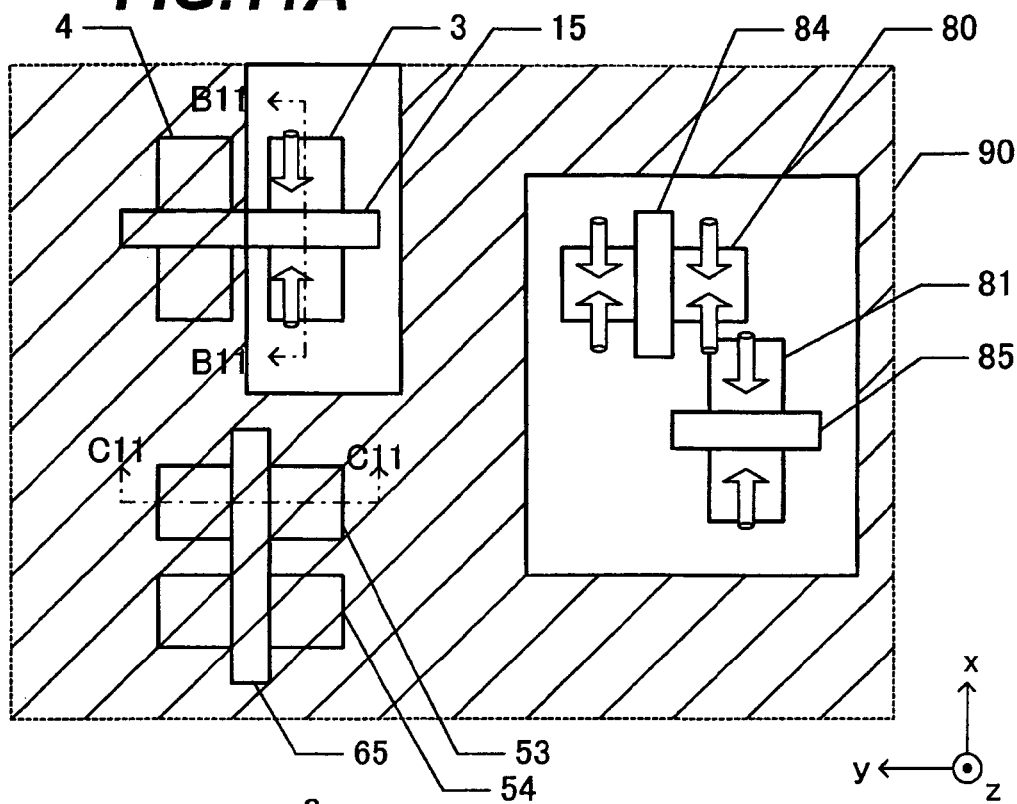
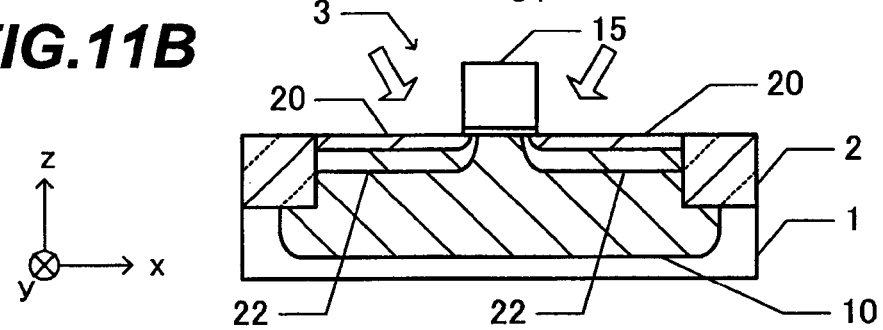
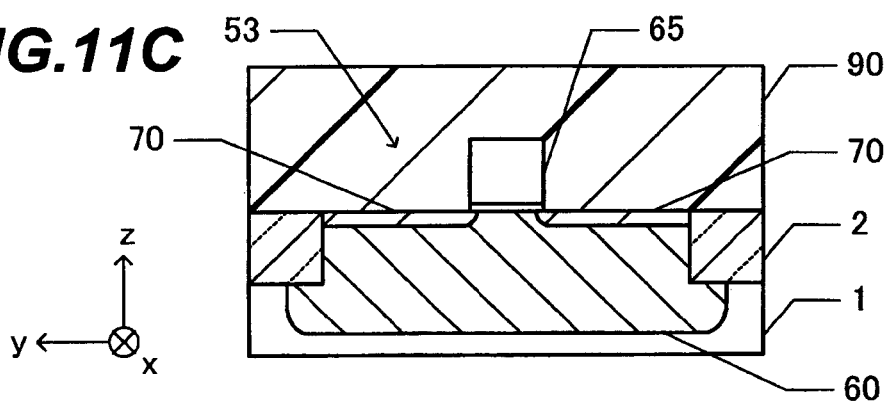

SEMICONDUCTOR DEVICE MANUFACTURING METHOD INCLUDING OBLIQUE ION IMPLANTATION PROCESS AND RETICLE PATTERN FORMING METHOD

CROSS REFERENCE TO RELATED APPLICATION

This application is based on and claims priority of Japanese Patent Application No. 2006-079227 filed on Mar. 22, 2006, the entire contents of which are incorporated herein by reference.

BACKGROUND OF THE INVENTION

A) Field of the Invention

The present invention relates to a semiconductor device manufacturing method and a reticle pattern forming method, and more particularly to a semiconductor device manufacturing method including an oblique ion implantation process and a method of forming reticle patterns to be used by the manufacturing method.

B) Description of the Related Art

FIG. 18A is a plan view of a static random access memory (SRAM), and FIG. 18B is a cross sectional view taken along one-dot chain line B18-B18 shown in FIG. 18A. A p-type well 215 and a p-type well 217 extending in a vertical direction in FIG. 18A are disposed in parallel to each other. An n-type well 216 is disposed between the p-type wells. A border between the n- and p-type wells is indicated by a broken line. One memory cell 210 having six MOS transistors extends from the inside of the p-type well 215 to the inside of the p-type well 217 passing across the n-type well region 216. A PMOS active region 211 is defined in the n-type well 216 and NMOS active regions 212 and 213 are defined in the p-type well 217.

One NMOS transistor T1 constituting a portion of the memory cell 210 is disposed in the NMOS active region 212 and another PMOS transistor T2 constituting a portion of the memory cell 210 is disposed in the PMOS active region 211. One gate pattern 205 intersecting both the PMOS active region 211 and NMOS active region 212 constitutes a gate pattern of the NMOS transistor T1 and PMOS transistor T2. Another gate pattern 206 intersects the PMOS active region 213.

When pocket implantation for the NMOS transistor T1 is to be performed, the PMOS active region 211 is covered with a resist pattern 220. Pocket implantation, also called halo implantation, means ion implantation for implanting impurity ions of a conductivity type opposite to that of source/drain regions into a region between the source region and channel region and a region between the drain region and channel region, deeper than the source/drain regions at a low impurity concentration, in order to suppress the short channel effect of MOS transistors. Impurity doped regions formed by pocket implantation are called pocket regions. Pocket implantation is also called halo implantation.

Pocket implantation is usually performed along oblique directions to make impurities sink into a region under the gate pattern. For example, ion implantation is performed along four directions in total: two directions tilting a virtual straight line perpendicular to the substrate surface in directions parallel to the direction (hereinafter simply called a "gate pattern direction") along which the gate pattern traverses the active region; and two directions tilting the virtual straight line in directions perpendicular to the gate pattern direction. Ion implantation is performed in some cases by rotating the substrate by 360°.

FIG. 18B shows ion implantation along a direction 230 tilting the virtual straight line perpendicular to the substrate surface from the side of the NMOS active region 212 toward the side of the PMOS active region 211. In this case, the PMOS active region 211 is covered with a resist pattern 220. As a space between the NMOS active region 212 and PMOS active region 211 becomes narrow, a portion of the NMOS active region 212 is shaded by the resist pattern 220. Impurity ions do not reach the shaded portion. An impurity concentration of the pocket region in the shaded portion is therefore lower than that in other portions.

A channel is likely to be generated in a low impurity concentration portion of the pocket region, more than a central portion of the active region. A desired threshold voltage cannot be obtained in some cases. A size of the shaded portion of the resist pattern 220 varies depending upon variations in the position and shape of the resist pattern 220. The characteristics of MOS transistors have therefore variations.

JP-A-HEI-8-279612 discloses pocket implantation techniques along two directions tilting toward a direction perpendicular to the gate pattern direction. If this pocket implantation along these two directions is performed, the NMOS active region 212 shown in FIG. 18B is not shaded by the resist pattern 220. It is therefore possible to suppress variations in the characteristics of the transistor T1.

SUMMARY OF THE INVENTION

Generally, a number of MOS transistors are disposed on a semiconductor substrate, and gate pattern directions of these MOS transistors are not always identical. For example, first and second MOS transistors are formed whose gate pattern directions are perpendicular to each other. If pocket implantation for the first MOS transistor is performed by using the method disclosed in JP-A-HEI-8-279612, a portion of the active region of the second MOS transistor may be shaded by the resist pattern. The invention disclosed in JP-A-HEI-8-279612 does not consider at all the relation between the ion implantation direction and the shape or the like of a resist pattern adjacent to the active region.

An object of the present invention is to provide a semiconductor device manufacture method capable of suppressing variations in impurity concentrations in a pocket region and preventing variations in MOS transistor characteristics. Another object of the present invention is to provide a method of forming a reticle pattern to be used by the semiconductor device manufacture method.

According to one aspect of the present invention, there is provided a method of manufacturing a semiconductor device comprising steps of:

(a) forming an isolation insulating film in a surface layer of a semiconductor substrate to form a first active region of a first conductivity type and an opposite conductivity type active region of a second conductivity type, the first active region and the opposite conductivity type active region being adjacent to each other across the isolation insulating film;

(b) covering the opposite conductivity type active region with a first resist pattern, with an edge of the first resist pattern being disposed on the isolation insulating film between the first active region and the opposite conductivity type active region; and (c) implanting impurity ions into a surface layer of the first active region by using the first resist pattern as a mask, wherein:

a first angle is defined as a tilt angle obtained by tilting a virtual plane being perpendicular to a surface of the semiconductor substrate and including an edge of the first active region, toward the first resist pattern by using as a fulcrum a point on the semiconductor substrate nearest to the first resist pattern, until the virtual plane contacts the first resist pattern; and in the step (c) the ion implantation is performed along a first incidence direction and not along a second incidence direction, the first incidence direction having a tilt angle from a substrate normal larger than the first angle and allowing ions passed through an uppermost edge of a sidewall of the first resist pattern on a side of the first active region to be incident upon an edge of the first active region on a side of the first resist pattern, or to be incident upon the isolation insulating film between the first active region and the first resist pattern, and the second direction allowing the ions passed through the uppermost edge of the sidewall of the first resist pattern on a side of the first active region to be incident upon the first active region.

According to another aspect of the present invention, there is provided a method of generating reticle patterns of a reticle for forming a resist pattern to be used for forming pocket regions of a first conductivity type transistor in a substrate with the first conductivity transistor and a second conductivity transistor being disposed, the method comprising steps of:

(A) defining an xy orthogonal coordinate system on the substrate and classifying a plurality of active regions, in which the first conductivity type transistor are disposed, into first, second and third groups, a gate pattern intersecting the active region of the first group in a y-direction, no active region that a gate pattern intersects in an x-direction being disposed at a position remote from the active region of the first group by a distance shorter than a layout standard distance based on a design rule, a gate pattern intersecting the active region of the second group in the x-direction, no active region that a gate pattern intersects in the y-direction being disposed at a position remote from the active region of the second group by a distance shorter than the layout standard distance, the active region of the third group intersecting a gate pattern extending in the y-direction but not belonging to the first group or intersecting a gate pattern extending the x-direction but not belonging to the second group; and (B) generating a first reticle pattern for forming a resist pattern which covers the active region belonging to the first group and exposing the active region belonging to at least one of the second and third groups.

In the semiconductor manufacture method, since ion implantation is not performed under the condition that ions passed through the upper edge of the first resist pattern become incident upon the inside of the first active region, the first active region will not be shaded by the first resist pattern. It is therefore possible to prevent formation of a portion having a relatively low impurity concentration in the first active region. By paying attention to this effect, it becomes possible to arrange active regions at a higher density.

In the reticle pattern forming method, by using the first reticle, the resist pattern is formed which exposes active regions of the second and third groups and covers active regions of the first group. Ion implantation for the active regions of the second and third groups can be performed independently from ion implantation for the active regions of the first group. Since the reticle patterns can be formed automatically, a load on a designer can be reduced.

BRIEF DESCRIPTION OF THE DRAWINGS

FIG. 10A is a first plan view of a semiconductor device during manufacture by a manufacture method according to a second embodiment, and FIGS. 10B and 10C are cross sectional views taken along one-dot chain lines B10-B10 and C10-C10 shown in FIG. 10A, respectively.

FIG. 11A is a second plan view of the semiconductor device during manufacture by the manufacture method according to the second embodiment, and FIGS. 11B and 11C are cross sectional views taken along one-dot chain lines B11-B11 and C11-C11 shown in FIG. 11A, respectively.

DESCRIPTION OF THE PREFERRED EMBODIMENTS

With reference to FIGS. 1A to 7D, description will be made on a semiconductor device manufacture method according to the first embodiment.

Figure 1A:
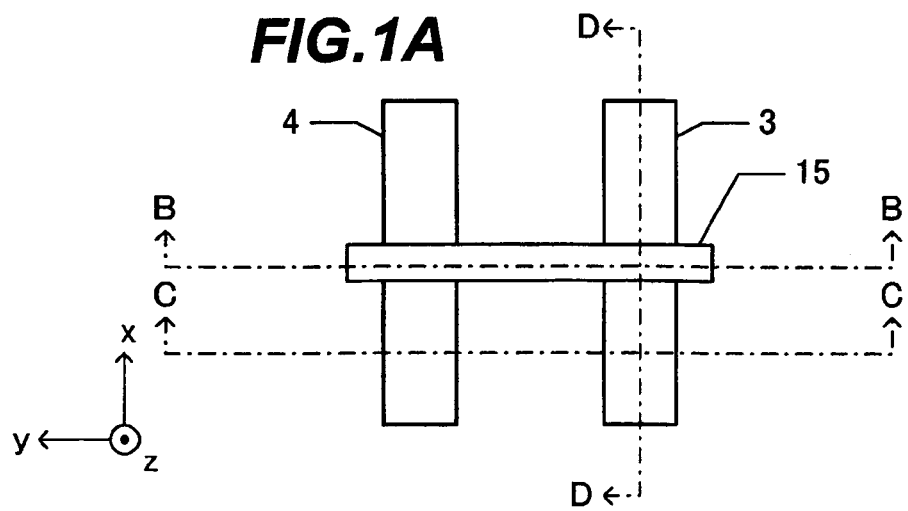
FIG. 1A is a first plan view of a semiconductor device during manufacture by a manufacture method according to a first embodiment.
Figure 1B:
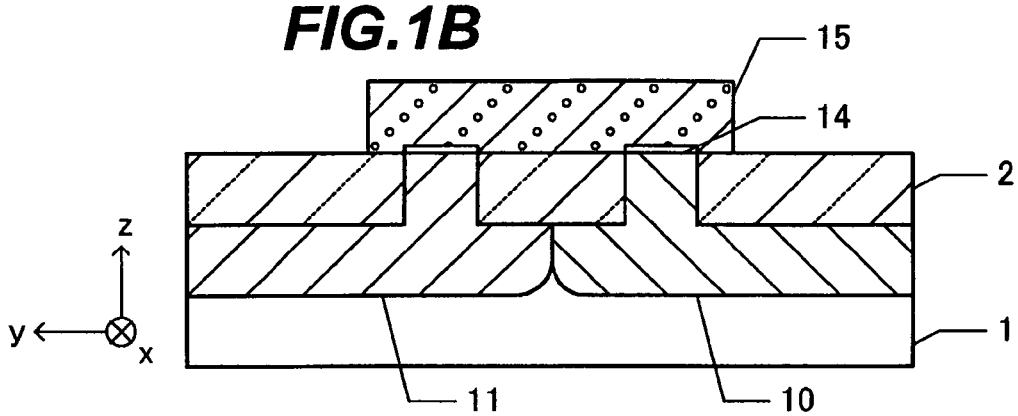
FIGS. 1B to 1D are cross sectional views taken along one-dot chain lines B-B, C-C and D-D shown in FIG. 1A, respectively.
Figure 1C:
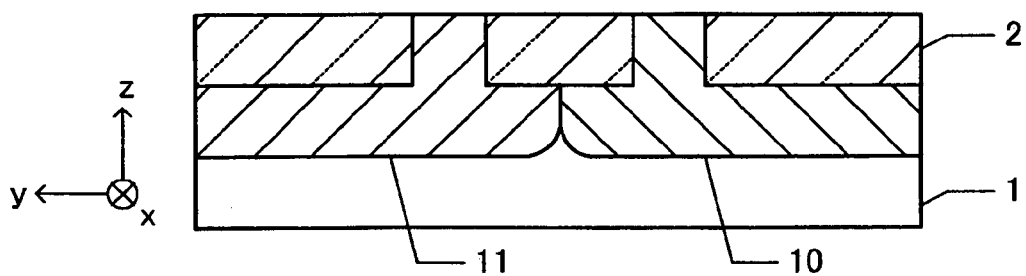
Figure 1D:
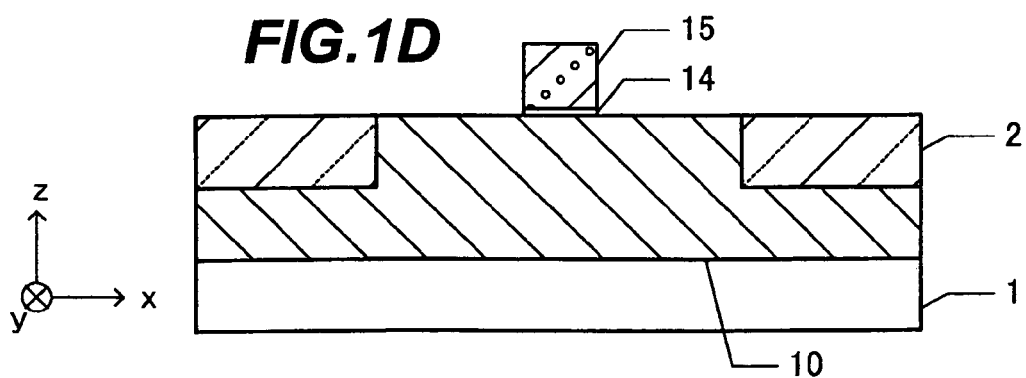

FIG. 1A is a plan view of a semiconductor device during manufacture, and FIGS. 1B, 1C and 1D are cross sectional views taken along one-dot chain lines B-B, C-C and D-D shown in FIG. 1A, respectively. FIGS. 2A to 2D, FIGS. 3A to 3D, FIGS. 4A to 4D, FIGS. 5A to 5D, FIGS. 6A to 6D, and FIGS. 7A to 7D are plan views and cross sectional views of the semiconductor device at the same position as that shown in FIGS. 1A to 1D and during different manufacturing processes.

As shown in FIGS. 1A to 1D, an isolation insulating film 2 of a shallow trench isolation (STI) structure is formed in a surface layer of a semiconductor substrate 1 made of silicon or the like to define active regions 3 and 4. An xyz orthogonal coordinate system is defined having the surface of the semiconductor substrate 1 as an xy plane and a normal direction to the substrate surface as a z-direction.

Each of the active regions 3 and 4 has a shape elongated in the x-direction. The active regions 3 and 4 are adjacent to each other along the y-direction across the isolation insulating film 2. A p-type well 10 is formed containing one active region 3, and an n-type well 11 is formed containing the other active region 4. The active region 3 is called an NMOS active region and the active region 4 is called a PMOS active region.

A gate pattern 15 made of polysilicon or the like intersects the NMOS active region 3 in the y-direction and extends over the PMOS active region 4, intersecting also the PMOS active region 4 in the y-direction. A gate insulating film 14 is disposed between the surface of the NMOS active region 3 and gate pattern 15 and between the surface of the PMOS active region 4 and gate pattern 15.

The structure shown in FIGS. 1A to 1D is formed by well-known techniques including photolithography, film deposition processes, etching, ion implantation and the like.

Figure 2A:
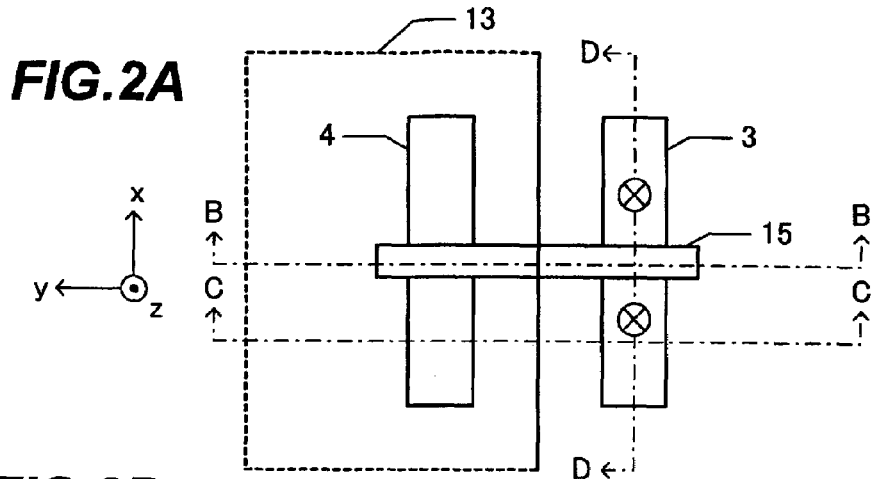
FIG. 2A is a second plan view of the semiconductor device during manufacture by the manufacture method according to the first embodiment.
Figure 2B:
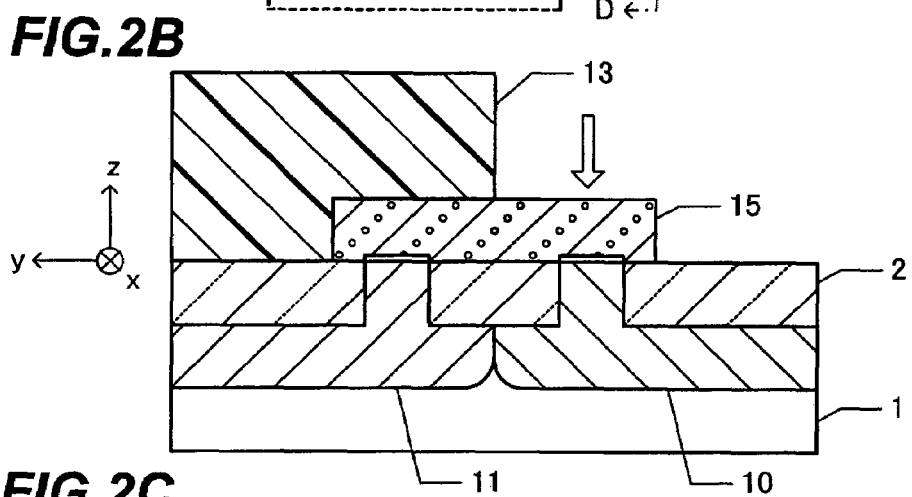
FIGS. 2B to 2D are cross sectional views taken along one-dot chain lines B-B, C-C and D-D shown in FIG. 2A, respectively.
Figure 2C:
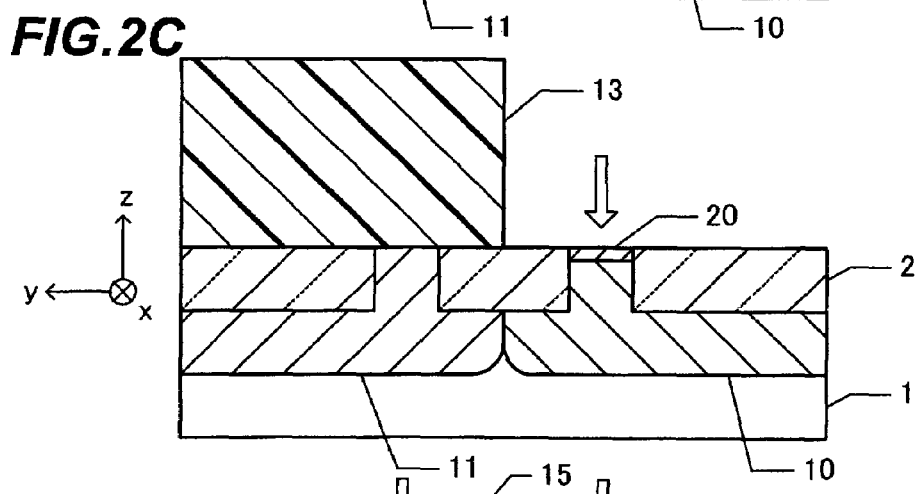
Figure 2D:
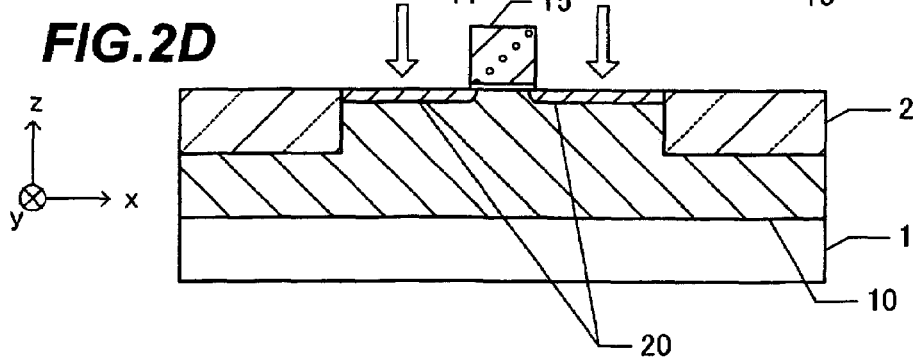

As shown in FIGS. 2A to 2C, the PMOS active region 4 is covered with a resist pattern 13. The edge of the resist pattern 13 passes in the x-direction over the isolation insulating film 2 between the NMOS active region 3 and PMOS active region 4. By using the resist pattern 13 as a mask, n-type impurity ions are implanted to form source/drain extension regions of the source/drain regions of an NMOS transistor. This ion implantation is performed along a direction generally perpendicular to the substrate surface. As shown in FIG. 2D, n-type source/drain extension regions 20 are therefore formed in a substrate surface layer on both sides of the gate pattern 15.

Figure 3A:
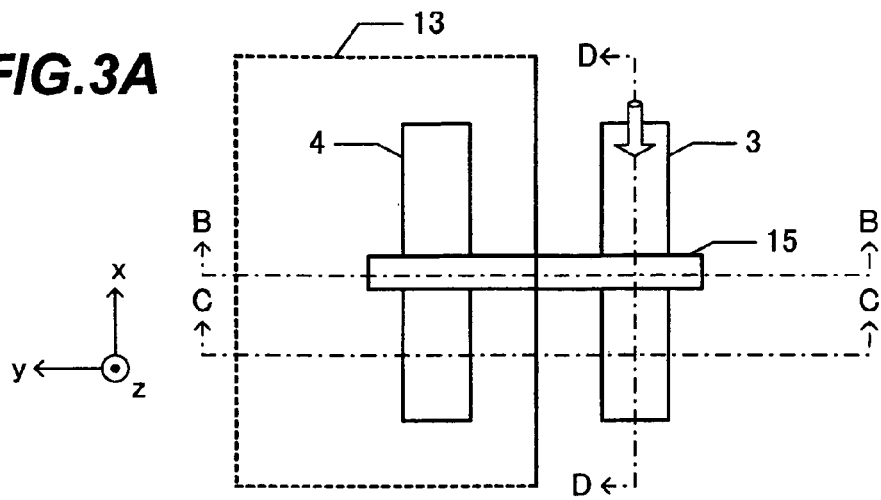
FIG. 3A is a third plan view of the semiconductor device during manufacture by the manufacture method according to the first embodiment.
Figure 3B:
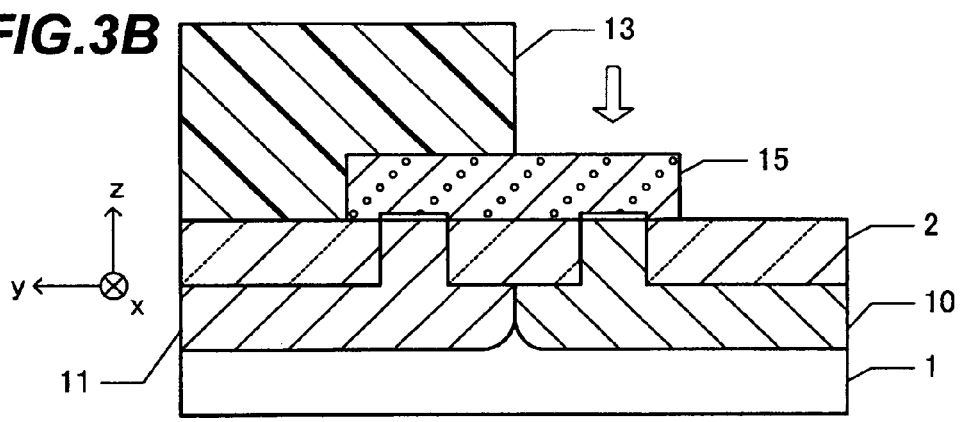
FIGS. 3B to 3D are cross sectional views taken along one-dot chain lines B-B, C-C and D-D shown in FIG. 3A, respectively.
Figure 3C:
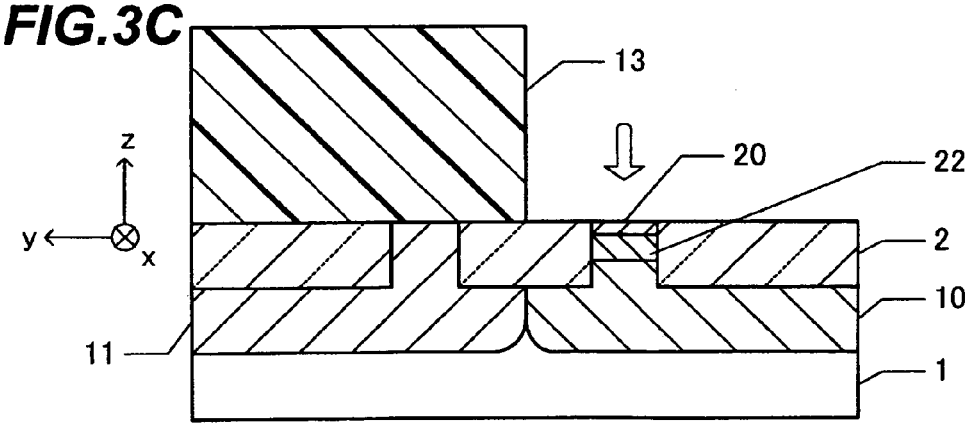
Figure 3D:
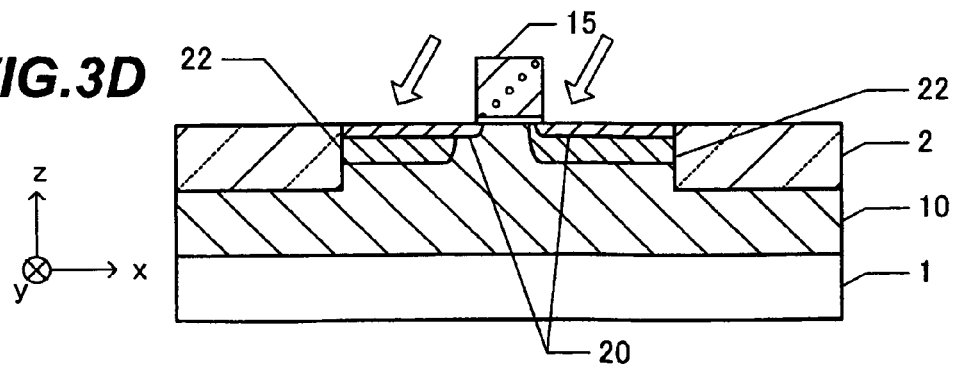

As shown in FIGS. 3A to 3D, by using the resist pattern 13 as a mask, p-type impurity ions are implanted to form pocket regions of the NMOS transistor. These ions are obliquely implanted along a virtual straight line tilting from a normal direction toward the positive direction of the x-axis. For example, as shown in FIG. 3D, ions are implanted along a virtual straight line tilting from the normal direction toward the right side in the figure.

As shown in FIGS. 3C and 3D, p-type pocket regions 22 are therefore formed in the surface layer of the NMOS active region 3. The pocket region 22 formed on the right side (positive side of the x-axis) of the gate pattern 15 extends to a region under the gate pattern 15, whereas the pocket region 22 formed on the left side (negative side of the x-axis) of the gate pattern 15 is spaced apart from the edge of the gate pattern 15 because impurities are not implanted in the portion shaded by the gate pattern 15.

The ion implantation for forming the pocket regions 22 is performed under the conditions that impurities reach the region deeper than the extension regions 20 and the impurity concentration of the pocket regions 22 is lower than that of the extension regions 20.

As shown in FIGS. 4A to 4D, ion implantation is performed under the same conditions, along a virtual straight line tilting from a normal direction toward the x-axis negative direction, i.e., along the direction tilting toward a direction opposite to a tilting direction of an ion beam for ion implantation in the process shown in FIGS. 3A to 3D. For example, in FIG. 4D, ion implantation is performed along a direction tilting from a normal direction toward the left side in the figure. With this ion implantation, also on the left side of the gate pattern 15, the pocket region 22 extends to a region under the gate pattern 15 so that a pair of pocket regions 22 becomes symmetrical with respect to the gate pattern 15. After the pocket implantation, the resist pattern 13 used as the mask is removed.

In the pocket implantation processes shown in FIGS. 3A to 4D, ion implantation is performed along directions tilting toward the x-axis positive and negative directions, but ion implantation along the direction tilting in the y-axis direction is not performed. Therefore, the NMOS active region 3 will not be shaded by the resist pattern 13.

Figure 5A:
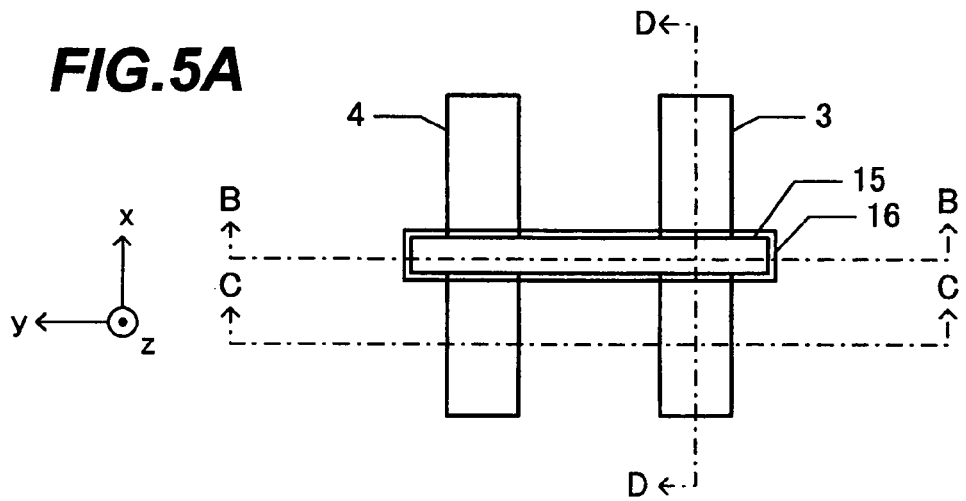
FIG. 5A is a fifth plan view of the semiconductor device during manufacture by the manufacture method according to the first embodiment.
Figure 5B:
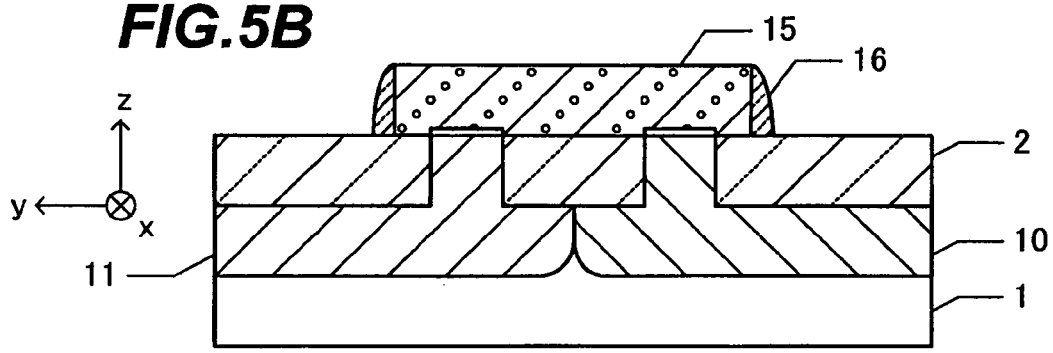
FIGS. 5B to 5D are cross sectional views taken along one-dot chain lines B-B, C-C and D-D shown in FIG. 5A, respectively.
Figure 5C:
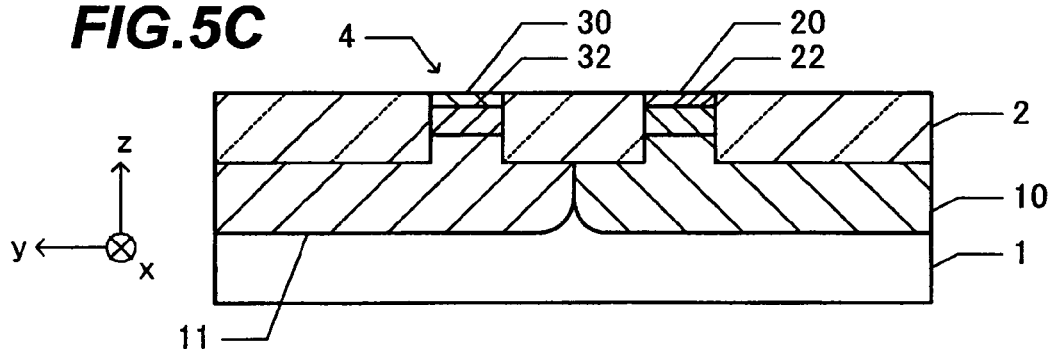

As shown in FIG. 5C, ion implantation processes are performed also in the PMOS active region 4 to form source/drain extension regions 30 and pocket regions 32.

Figure 5D:
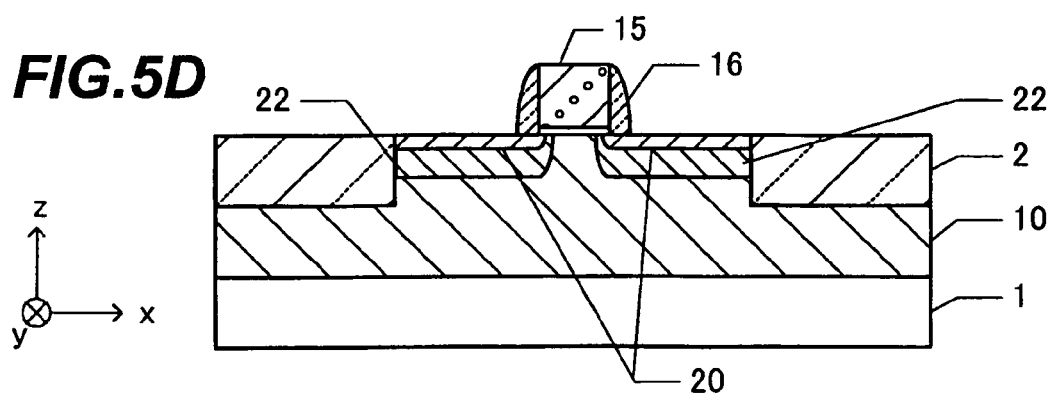

As shown in FIGS. 5A, 5B and 5D, sidewall spacers 16 of silicon oxide are formed on the sidewalls of the gate pattern 15.

Figure 6A:
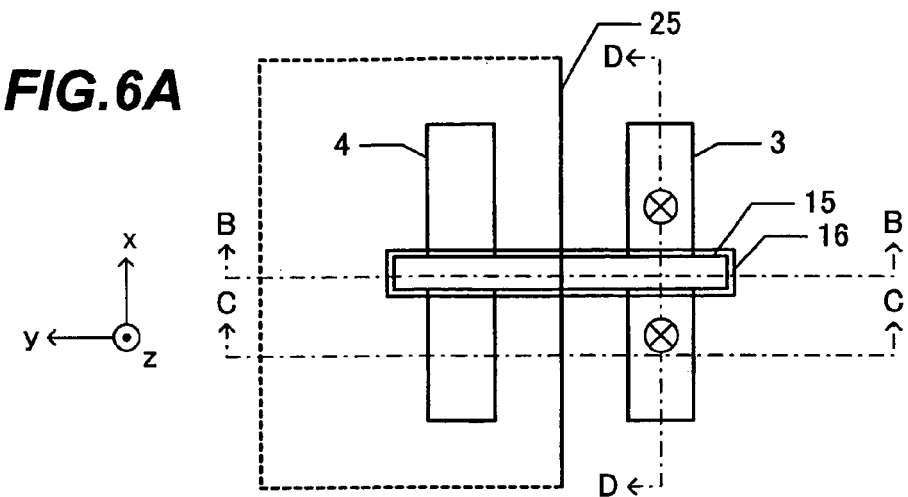
FIG. 6A is a sixth plan view of the semiconductor device during manufacture by the manufacture method according to the first embodiment.
Figure 6B:
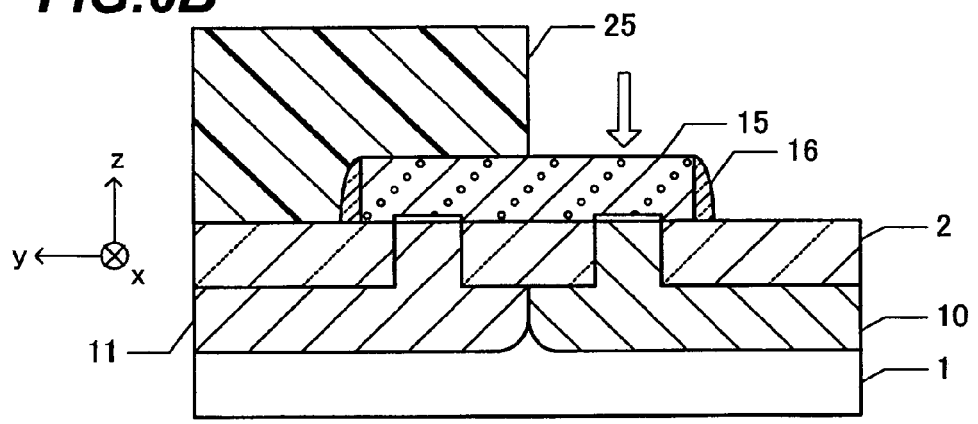
FIGS. 6B to 6D are cross sectional views taken along one-dot chain lines B-B, C-C and D-D shown in FIG. 6A, respectively.
Figure 6C:
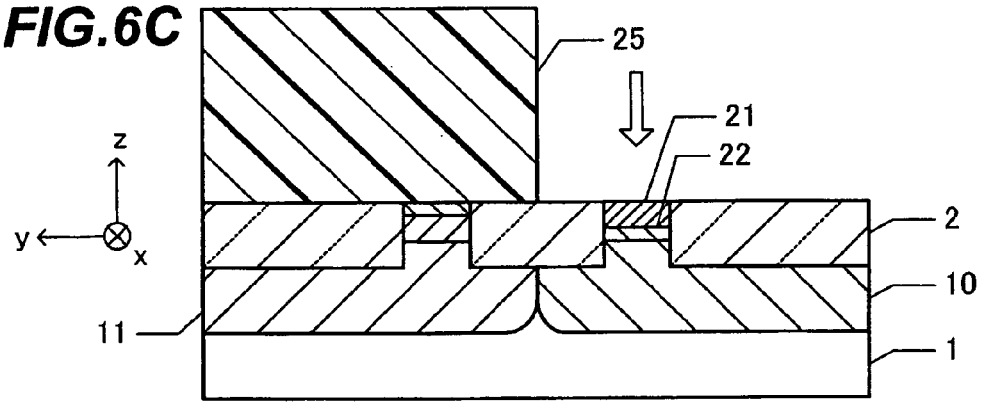
Figure 6D:
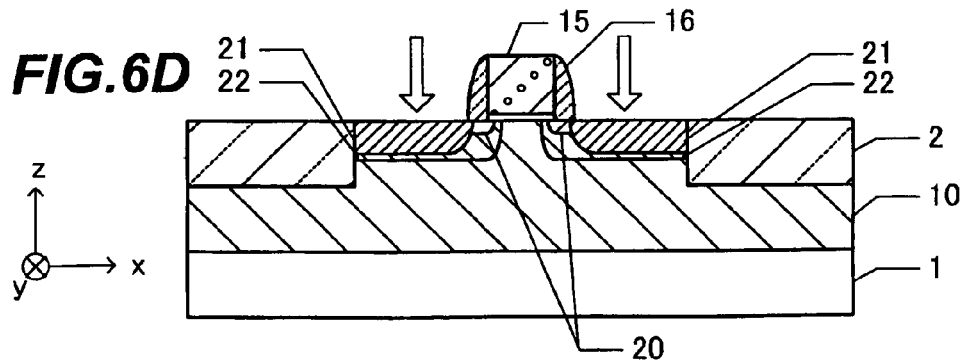

As shown in FIGS. 6A to 6C, the PMOS active region 4 is covered with a resist pattern 25. By using the resist pattern 25 as a mask, n-type impurity ions are implanted in the surface layer of the NMOS active region 3. This ion implantation is performed along a direction generally parallel to the substrate normal. As shown in FIG. 6D, deep source/drain regions 21 are therefore formed. The ion implantation for forming the deep regions 21 is performed under the conditions that an impurity concentration of the deep regions 21 is higher than that of the extension regions 20 and the deep regions 21 are deeper than the extension regions 20. After this ion implantation, the resist pattern 25 used as the mask is removed.

Figure 7A:
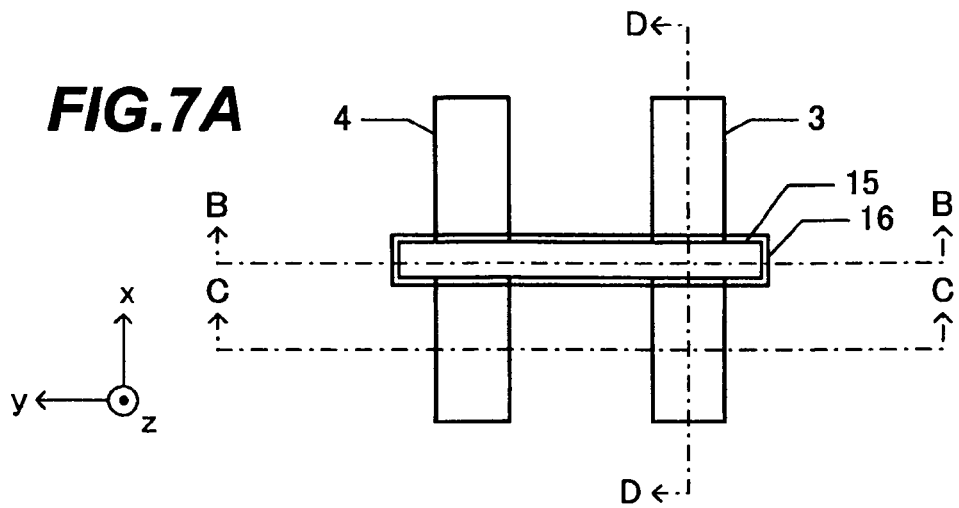
FIG. 7A is a seventh plan view of the semiconductor device during manufacture by the manufacture method according to the first embodiment.
Figure 7B:
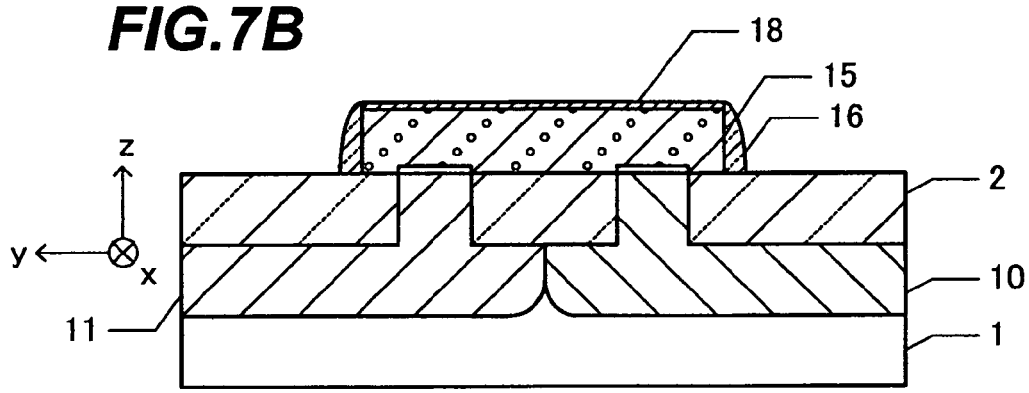
FIGS. 7B to 7D are cross sectional views taken along one-dot chain lines B-B, C-C and D-D shown in FIG. 7A, respectively.
Figure 7C:
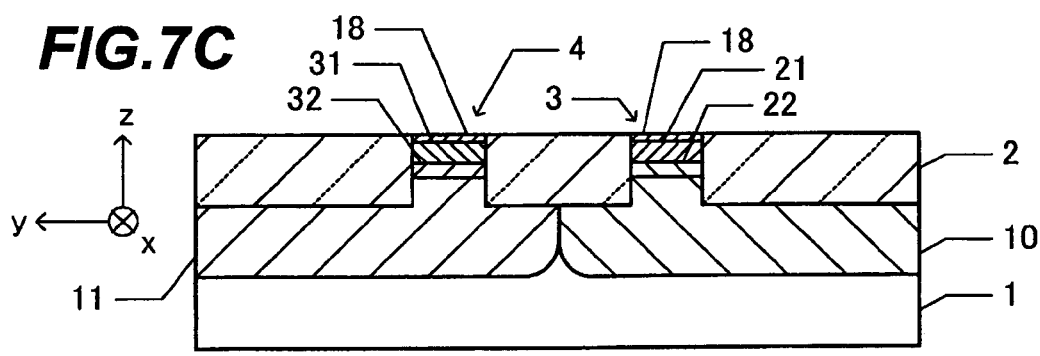

As shown in FIG. 7C, ion implantation is performed also in the PMOS active region 4 to form deep source/drain regions 31 of the PMOS transistor.

Figure 7D:
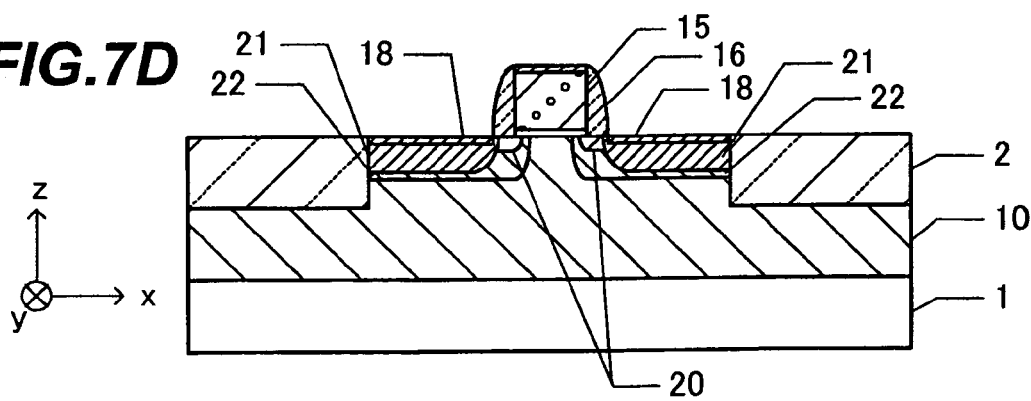

As shown in FIGS. 7B to 7D, metal silicide films 18 made of cobalt silicide, titanium silicide or the like are formed on the upper surface of the gate pattern 15 and the upper surfaces of the deep source/drain regions 21 and 31. The metal silicide film 18 can be formed by a well-known self-aligned silicide method (salicide method).

Figure 8:
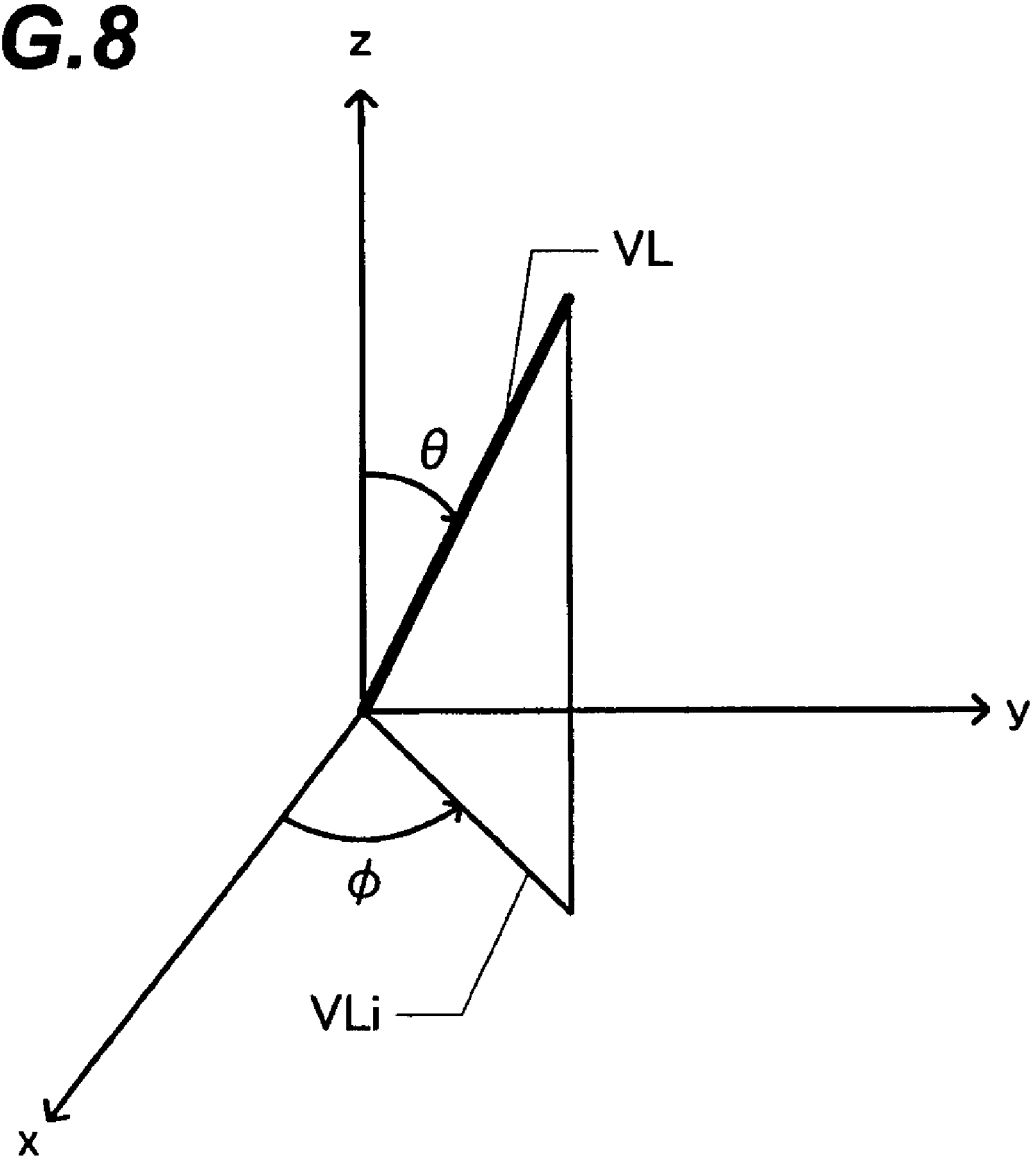
FIG. 8 is a diagram explaining the definitions of a tilt angle and an azimuth angle.

In the first embodiment, in the pocket implantation processes shown in FIGS. 3A to 4D, ion implantation is performed along the directions tilting from a normal direction in the x-axis direction, and ion implantation will not be performed along the directions tilting from a normal direction in the y-axis direction. It is therefore possible to avoid the NMOS active region 3 from being shaded by the resist pattern 13. With reference to FIGS. 8 to 9F, description will be made on general conditions capable of avoiding the NMOS active region 3 from being shaded by the resist pattern 13.

FIG. 8 shows the xyz orthogonal coordinate system using the surface of a semiconductor substrate as the xy plane. Consider now a virtual straight line VL crossing the xy plane and also a reference straight line passing through the cross point between the xy plane and the virtual straight line VL and being in parallel to the z-axis. A tilt angle from the reference straight line to the virtual straight line VL is called a tilt angle $\theta$ of the virtual straight line VL. A rotation angle from the positive direction of the x-axis to an image VLi of the virtual straight line VL vertically projected on the xy plane is called an azimuth angle $\phi$. A rotation direction from the positive direction of the x-axis to the positive direction of the y-axis is defined as the positive direction of the azimuth angle $\phi$. If ion implantation is performed by an ion beam along the virtual straight line having the tilt angle $\theta$ and azimuth angle $\phi$, the tilt angle $\theta$ is called an "ion implantation tilt angle" and the azimuth angle $\phi$ is called an "ion implantation azimuth angle".

Figure 9A:
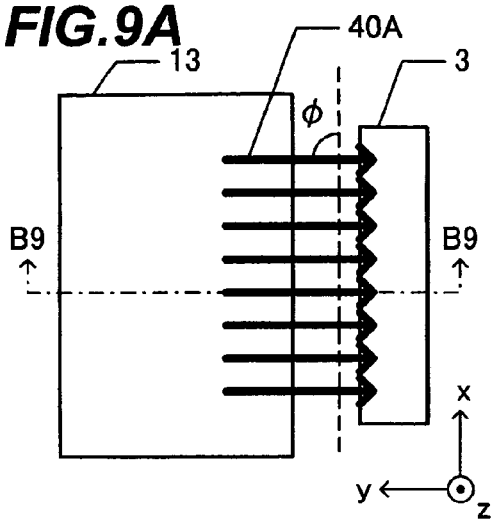
FIGS. 9A, 9C and 9E are plan views showing a positional relation among an incidence direction of an ion beam, an active region and a resist pattern.
Figure 9B:
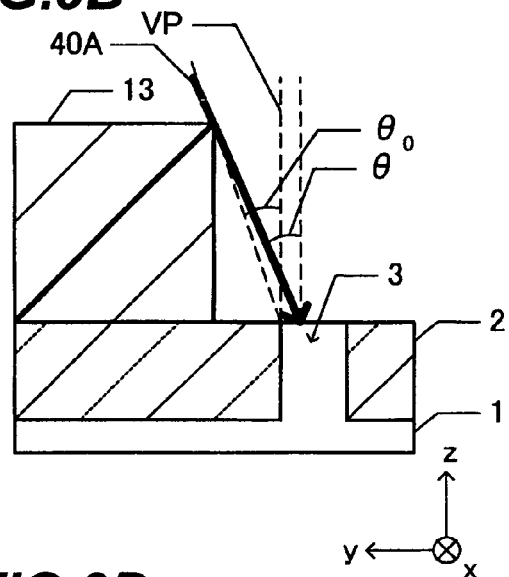
FIGS. 9B, 9D and 9F are cross sectional views taken along one-dot chain lines B9-B9, D9-D9 and F9-F9 shown in FIGS. 9A, 9C and 9E, respectively.
Figure 9C:
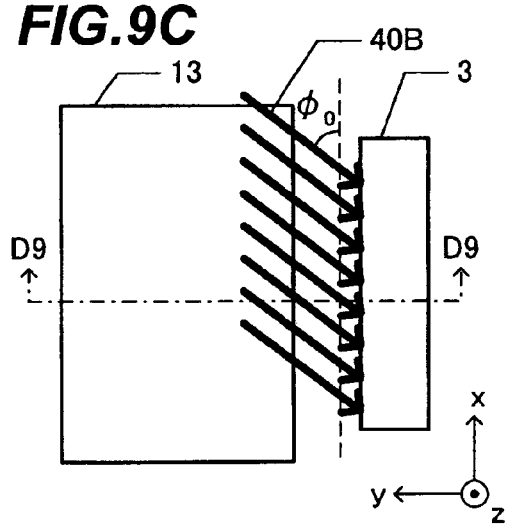
Figure 9D:
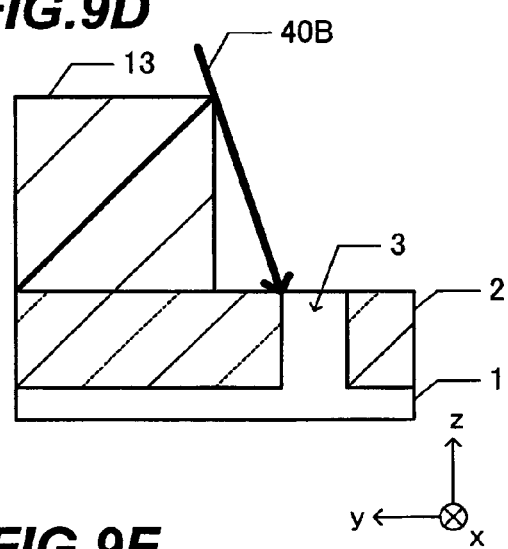
Figure 9E:
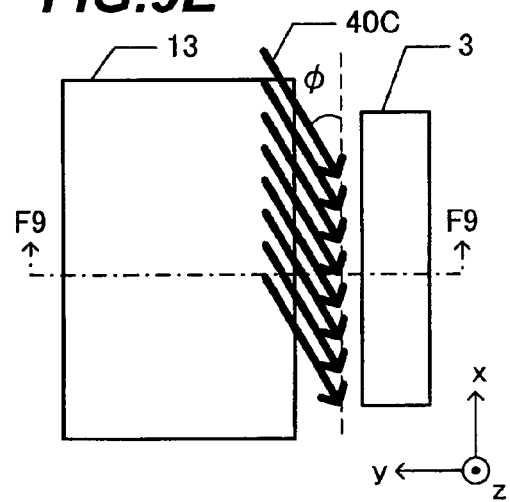
Figure 9F:
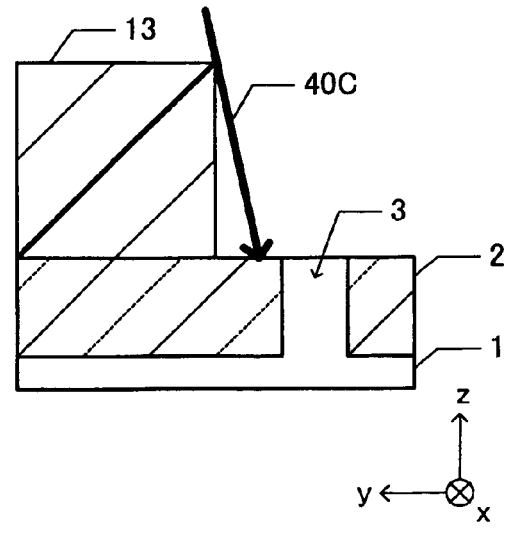

FIGS. 9A, 9C and 9E are plan views showing the NMOS active region 3 and the resist pattern 13 disposed near at the NMOS active region 3. FIG. 9B is a cross sectional view taken along one-dot chain line B9-B9 shown in FIG. 9A, FIG. 9D is a cross sectional view taken along one-dot chain line D9-D9 shown in FIG. 9C, and FIG. 9F is a cross sectional view taken along one-dot chain line F9-F9 shown in FIG. 9E. Propagation directions of ion beams are indicated by arrows 40A, 40B and 40C.

The NMOS active region 3 has a shape elongated in the x-direction, and the edge of the resist pattern 13 facing the NMOS active region 3 is disposed being spaced apart from the NMOS active region 3 in the y-direction. Opposing edges of the NMOS active region 3 and resist pattern 13 are both straight lines parallel to the x-axis. The direction from the NMOS active region 3 toward the resist pattern 13 is defined as the positive direction of the y-axis.

As shown in FIG. 9B, consider now a virtual plane VP parallel to the z-axis and including the edge of the NMOS active region 3 on the side of the resist pattern 13. A tilt angle obtained by tilting the virtual plane VP toward the resist pattern 13 using the edge of the NMOS active region as a fulcrum, until the virtual plane contacts the resist pattern 13, is called a first angle $\theta_0$. Consider the case in which the tilt angle $\theta$ of ion implantation is set larger than the first angle $\theta_0$.

As the ion implantation azimuth angle $\phi$ is set to 90° as shown in FIG. 9A, the ion beam passed through the upper edge of the resist pattern 13 enters the inside of the NMOS active region 3 as shown in FIG. 9B. The portion of the NMOS active region 3 nearer to the resist pattern 13 from this incidence position is shaded by the resist pattern 13.

As the ion implantation azimuth angle $\phi$ is set to an azimuth angle smaller than 90° as shown in FIG. 9C, the ion beam passed through the upper edge of the resist pattern 13 enters the edge of the NMOS active region 3 as shown in FIG. 9D.

This azimuth angle $\phi$ is designated as an azimuth angle $\phi_0$. This azimuth angle $\phi_0$ is dependent upon the ion implantation tilt angle $\theta$.

As the azimuth angle $\phi$ is set much smaller as shown in FIG. 9E, the ion beam passed through the upper edge of the resist pattern 13 enters the isolation insulating film 2 between the NMOS active region 3 and resist pattern 13 as shown in FIG. 9F.

If the ion implantation tilt angle $\theta$ is set larger than the first tilt angle $\theta_0$, the ion implantation azimuth angle $\phi$ is set in the range of 0°±$\phi_0$ expressed by $\phi_0$ defined in FIG. 9C so that the NMOS active region 3 will not be shaded by the resist pattern 13 and impurity ions can be implanted uniformly along the in-plane direction. Similarly, as the ion implantation azimuth angle $\phi$ is set in the range of 180°±$\phi_0$, it is obvious that the NMOS active region 3 will not be shaded by the resist pattern 13 and impurity ions can be implanted uniformly along the in-plane direction. If the resist pattern does not exist to the right side of the NMOS active region 3 in FIGS. 9A to 9F and as the azimuth angle $\phi$ is set in the range from 180°+$\phi_0$ to 360°−$\phi_0$, it is obvious that the NMOS active region 3 will not be shaded by the resist pattern 13 and impurity ions can be implanted uniformly along the in-plane direction.

In general, the condition that an ion beam passed through the upper edge of the resist pattern on the side of the active region enters the edge of the active region on the side of the resist pattern or enters the isolation insulating film between the active region and resist pattern, is called a "condition that the active region is not shaded by the resist pattern".

In the pocket implantation process shown in FIG. 3A of the first embodiment, ion implantation is performed at the azimuth angle of 0°. In the first embodiment, if the azimuth angle for pocket implantation is set in the range of 0°±$\phi_0$ expressed by $\phi_0$ defined in FIG. 9C, impurity ions can be implanted uniformly in the NMOS active region 3. In the pocket implantation process shown in FIG. 4A, ion implantation is performed at the azimuth angle of 180°. This ion implantation azimuth angle may be set in the range of 180°±$\phi_0$.

Figure 4A:
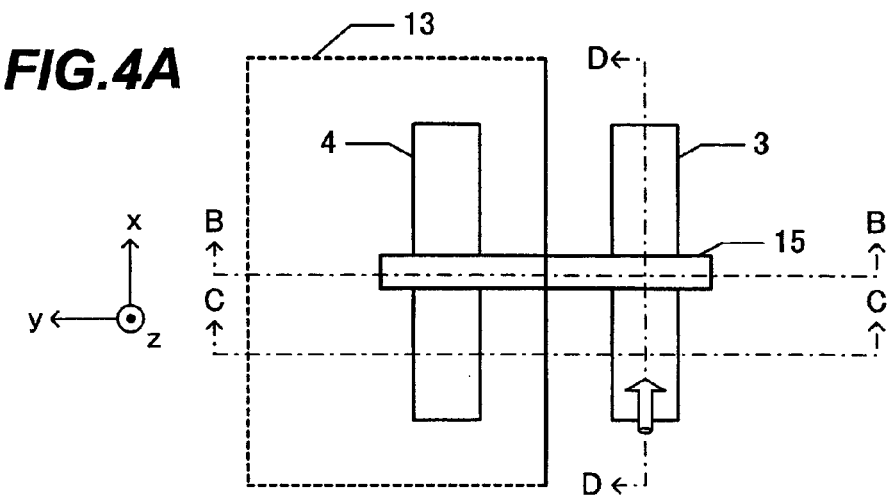
FIG. 4A is a fourth plan view of the semiconductor device during manufacture by the manufacture method according to the first embodiment.
Figure 4B:
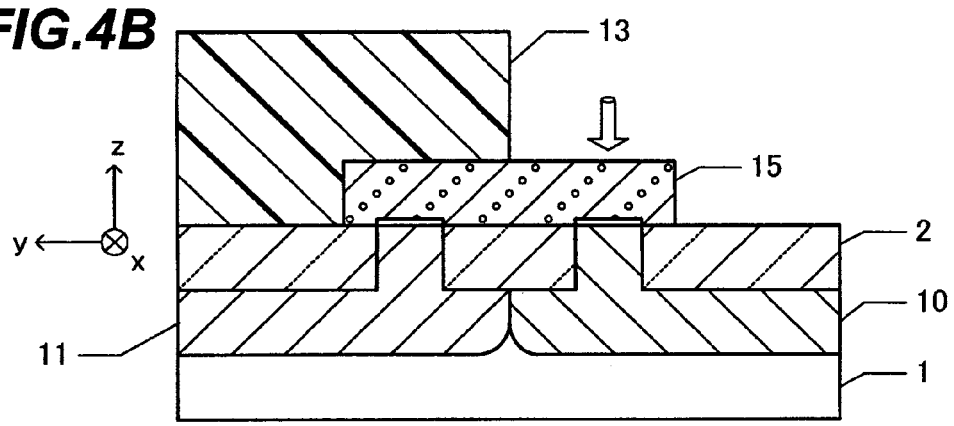
FIGS. 4B to 4D are cross sectional views taken along one-dot chain lines B-B, C-C and D-D shown in FIG. 4A, respectively.
Figure 4C:
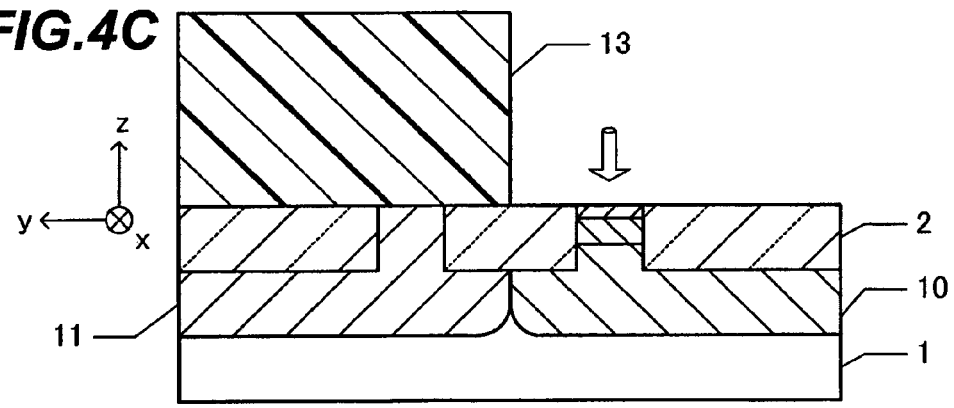
Figure 4D:
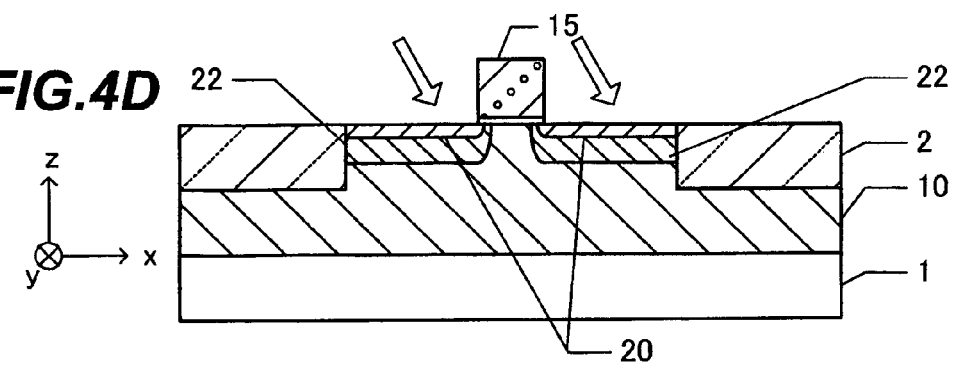

In the processes shown in FIGS. 3A and 4A, as the azimuth angle for pocket implantation is set near at 90° or 270°, the length in the lateral direction of a portion of the pocket regions 20 shown in FIGS. 3D and 4D under the gate pattern 150 becomes short. In order to make the pocket regions 20 go sufficiently deep into the surface layer under the gate pattern 15, it is preferable to set the azimuth angle for pocket implantation in the range of −45° to 45° and in the range of 135° to 225°.

As shown in FIG. 9A, if ion implantation is performed at an azimuth angle of 90° and the active region 3 is not to be shaded by the resist pattern 13, it is necessary to make small the ion implantation tilt angle $\theta$ or to make the edge of the resist pattern 13 spaced apart from the active region 3. If an active region of the opposite conductivity type is disposed near the active region 3, it is not possible to make the edge of the resist pattern 13 sufficiently spaced apart from the active region 3. Therefore, if active regions are disposed at a high density, the effects of the first embodiment are considerable. In other words, by paying attention to the effects of the first embodiment, it is possible to design active regions disposed at a high density.

In the first embodiment, pocket implantation for MOS transistors has been described illustratively. However, the method of the first embodiment is effective for the case in which a resist pattern is disposed near an active region and ion implantation for the active region is required to be performed at a large tilt angle. It is particularly effective for the case in which ion implantation is required to be performed at a tilt angle larger than the first tilt angle $\theta_0$ defined in FIG. 9B.

Next, with reference to FIGS. 10A to 12C, description will be made on a semiconductor device manufacture method according to the second embodiment.

FIG. 10A shows a plan view of a semiconductor device, and FIGS. 10B and 10C are cross sectional views taken along one-dot chain lines B10-B10 and C10-C10 shown in FIG. 10A, respectively. An xyz orthogonal coordinate system is defined using the surface of the semiconductor substrate 1 as an xy plane. An isolation insulating film 2 is formed in the surface layer of the semiconductor substrate 1. The isolation insulating film 2 defines NMOS active regions 3, 53, 80 and 81, and PMOS active regions 4 and 54. The NMOS active regions 3 and 81 and PMOS active region 4 have a shape elongated in the x-direction, and the NMOS active regions 53 and 80 and PMOS active region 54 have a shape elongated in the y-direction.

The NMOS active region 3 and PMOS active region 4 are disposed with the same positional relation as that of the NMOS active region 3 and PMOS active region 4 of the first embodiment shown in FIG. 1A. The NMOS active region 53 and PMOS active region 54 are disposed with a space therebetween in the x-axis direction.

A gate pattern 15 intersects the NMOS active region 3 and PMOS active region 4 in the y-direction. A gate pattern 65 intersects the NMOS active region 53 and PMOS active region 54 in the x-direction. A gate pattern 84 intersects the NMOS active region 80 in the x-direction, and a gate pattern 85 intersects the NMOS active region 81 in the y-direction. The PMOS active regions 4 and 54 are disposed near the NMOS active regions 3 and 53. A PMOS active region is not disposed near the NMOS active regions 80 and 81.

As shown in FIG. 10B, extension regions 20 of source/drain regions are disposed in a surface layer of the NMOS active region 3 on both sides of the gate pattern 15. As shown in FIG. 10C, extension regions 70 of source/drain regions are disposed in a surface layer of the NMOS active region 53 on both sides of the gate pattern 65. Extension regions are also disposed in the surface layers of the other NMOS active regions 80 and 81 on both sides of the gate patterns 84 and 85.

As shown in FIG. 11A, a resist pattern 90 exposes the NMOS active regions 3, 80 and 81 and covers the NMOS active region 53 and PMOS active regions 4 and 54. The positional relation between the NMOS active region 3 and resist pattern 90 is the same as that between the NMOS active region 3 and resist pattern 13 of the first embodiment shown in FIGS. 3A and 4A. By using the resist pattern 90 as a mask, ion implantation for forming pocket regions is performed at azimuth angles of 0° and 180°. This ion implantation may be performed at different azimuth angles if it is performed under the conditions that the active region 3 is not shaded by the resist pattern 90.

FIGS. 11B and 11C are cross sectional views taken along one-dot chain lines B11-B11 and C11-C11 shown in FIG. 11A. As shown in FIG. 11B, pocket regions 22 are formed in the surface layer of the NMOS active region 3 on both sides of the gate pattern 15. At the same time, pocket regions are formed in the surface layers of the active regions 80 and 81 on both sides of the gate patterns 84 and 85. However, in the NMOS active region 80, the gate pattern 84 intersects the NMOS active region 80 in the x-direction. Since ion implantation is performed by inclining an ion beam in the x-direction, the pocket regions hardly extends to a region under the gate pattern 84.

As shown in FIG. 11C, since the NMOS active region 53 is covered with the resist pattern 90, impurities will not be implanted into the surface layer of the NMOS active region 53.

Figure 12A:
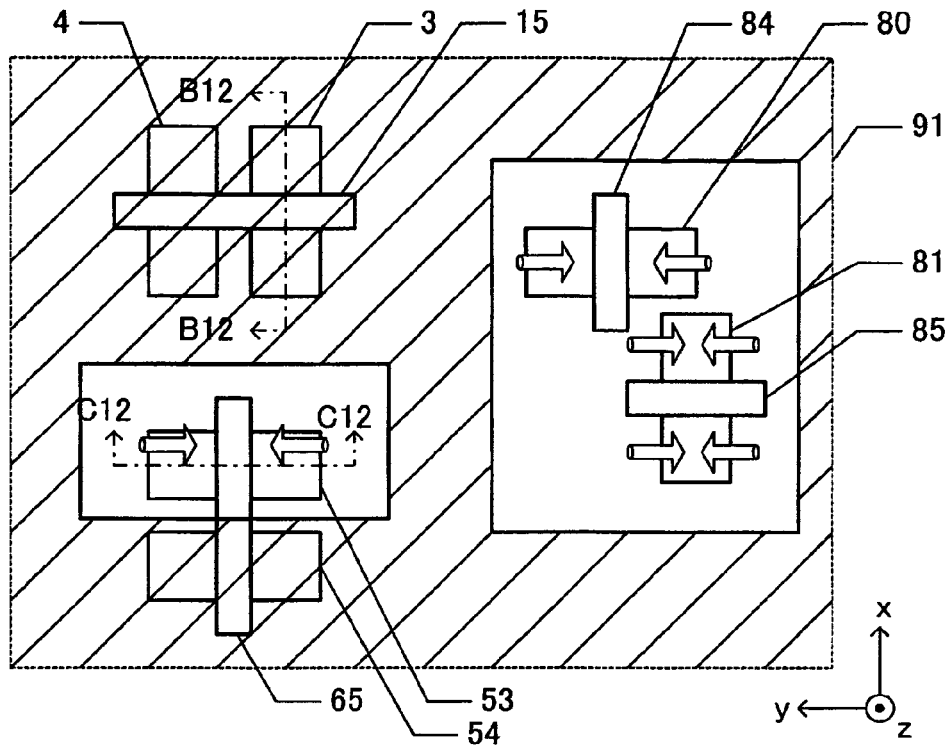
FIG. 12A is a third plan view of the semiconductor device during manufacture by the manufacture method according to the second embodiment.

As shown in FIG. 12A, the resist pattern 90 is removed and another resist pattern 91 is formed. The resist pattern 91 exposes the NMOS active regions 53, 80 and 81 and covers the other NMOS active region 3. The resist pattern 90 covers also the PMOS active regions 4 and 54.

Ion implantation for forming pocket regions is performed at azimuth angles of 90° and 270°. This ion implantation may be performed at different azimuth angles if it is performed under the conditions that the NMOS active region 53 is not shaded by the resist pattern 91 covering the PMOS active region 54 near the NMOS active region 53.

Figure 12B:
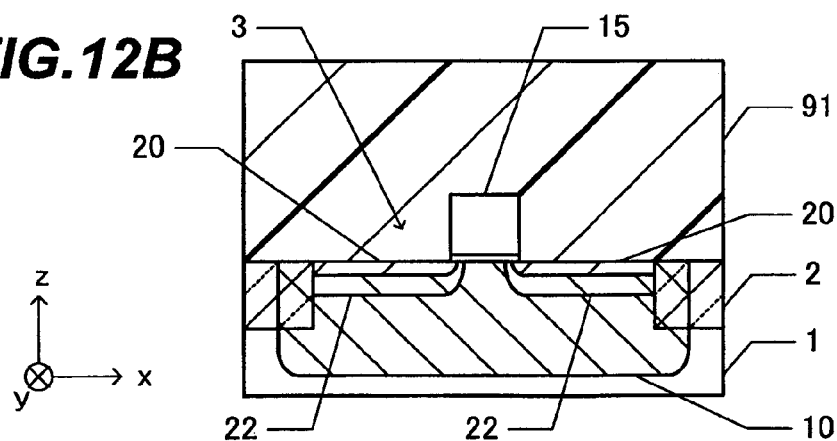
FIGS. 12B and 12C are cross sectional views taken along one-dot chain lines B12-B12 and C12-C12 shown in FIG. 12A, respectively.
Figure 12C:
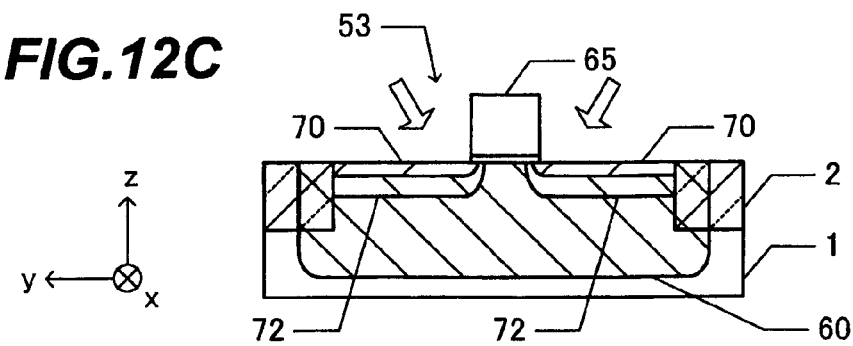

As shown in FIG. 12C, pocket regions 72 are formed in the surface layer of the NMOS active region 53 on both sides of the gate pattern 65. Also in the other NMOS active regions 80 and 81, pocket implantation is performed on both sides of the gate patterns 84 and 85. In the pocket implantation process shown in FIG. 11A, impurities do not extend to a region under the gate pattern 84, but in the pocket implantation process shown in FIG. 12A, impurities extend to a region under the gate pattern 84.

As shown in FIG. 12B, impurities are not implanted into the NMOS active region 3 because it is covered with the resist pattern 91.

The resist pattern 91 is removed thereafter, and source/drain extension regions and pocket regions of PMOS transistors are formed. Then, sidewall spacers are formed on the sidewalls of the gate patterns, and deep source/drain regions of NMOS and PMOS transistors are formed.

When pocket implantation is performed for the NMOS active region 3 shown in FIG. 11A, if the pocket implantation is performed at the same time for the other NMOS active region 53, this ion implantation is performed for the NMOS active region 53 under the condition that this active region is shaded by the resist pattern. Similarly, when pocket implantation is performed for the NMOS active region 53 shown in FIG. 12A, if the pocket implantation is performed at the same time for the other NMOS active region 3, this ion implantation is performed for the NMOS active region 3 under the condition that this active region is shaded by the resist pattern.

In the second embodiment, when pocket implantation is performed for the NMOS active region 3 crossing the gate pattern 15 extending in the y-direction, the NMOS active region 53 crossing the gate pattern 65 extending in the x-direction is covered with the resist pattern 90. Further, when pocket implantation is performed for the NMOS active region 53, the other NMOS active region 3 is covered with the resist pattern 91. Therefore, ion implantation is not performed for both the NMOS active regions 3 and 53 under the condition that the active regions are shaded by the resist patterns. Further, since pocket implantation is performed for the NMOS active regions 3 and 53 under the same condition, namely the pocket implantation is performed twice for each of the NMOS active regions 3 and 53, it is possible to suppress variations in the characteristics of two NMOS transistors having gate patterns perpendicular to each other.

A PMOS active region is not disposed near the NMOS active regions 80 and 81. It is therefore possible to make the edge of the resist pattern 90 spaced apart from the edges of the NMOS active regions 80 and 81. Therefore, in both the pocket implantation processes shown in FIGS. 11A and 12A, the NMOS active regions 80 and 81 will not be shaded by the resist pattern 90. Further, since pocket implantation is performed for the NMOS active regions 80 and 81 under the same condition, namely the pocket implantation is performed four times for each of the NMOS active regions 80 and 81, it is possible to suppress variations in the characteristics of two NMOS transistors having gate patterns perpendicular to each other.

Figure 13:
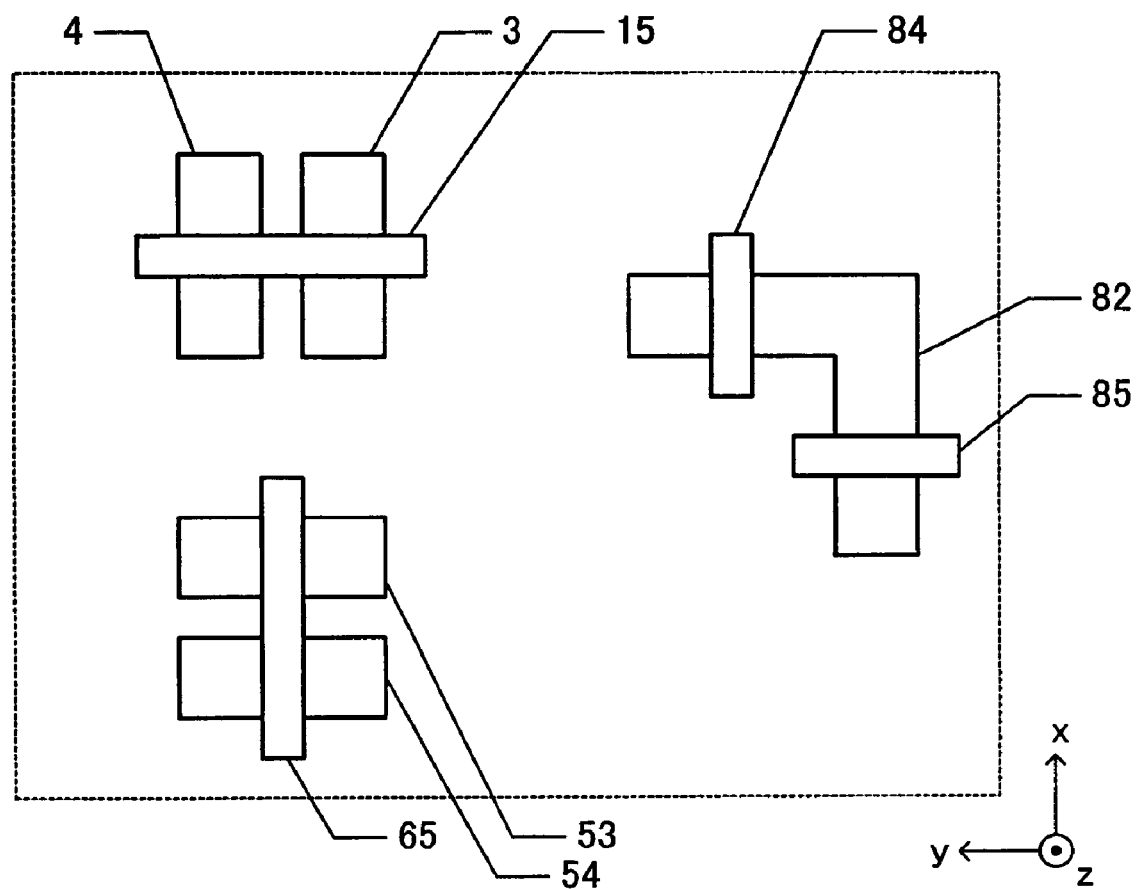
FIG. 13 is a plan view of a semiconductor device to be manufactured by a manufacture method according to a third embodiment.

FIG. 13 is a plan view of a semiconductor device to be manufactured by a manufacture method according to the third embodiment. In the third embodiment, two active regions 80 and 81 shown in FIG. 11A are coupled with each other to constitute one active region 82. Gate patterns 84 and 85 traverse the NMOS active region 82 in the x- and y-directions, respectively. The layout of other active regions is the same as that of the second embodiment. In the third embodiment, in the pocket implantation process of the second embodiment shown in FIG. 11A, the NMOS active region 82 is exposed, and also in the pocket implantation process shown in FIG. 12A, the NMOS active region 82 is exposed.

It is therefore possible to suppress variations in the characteristics of two NMOS transistors disposed in the NMOS active region 82.

Next, with reference to FIGS. 14A to 15B, description will be made on a method of forming reticle patterns according to the fourth embodiment.

Figure 14A:
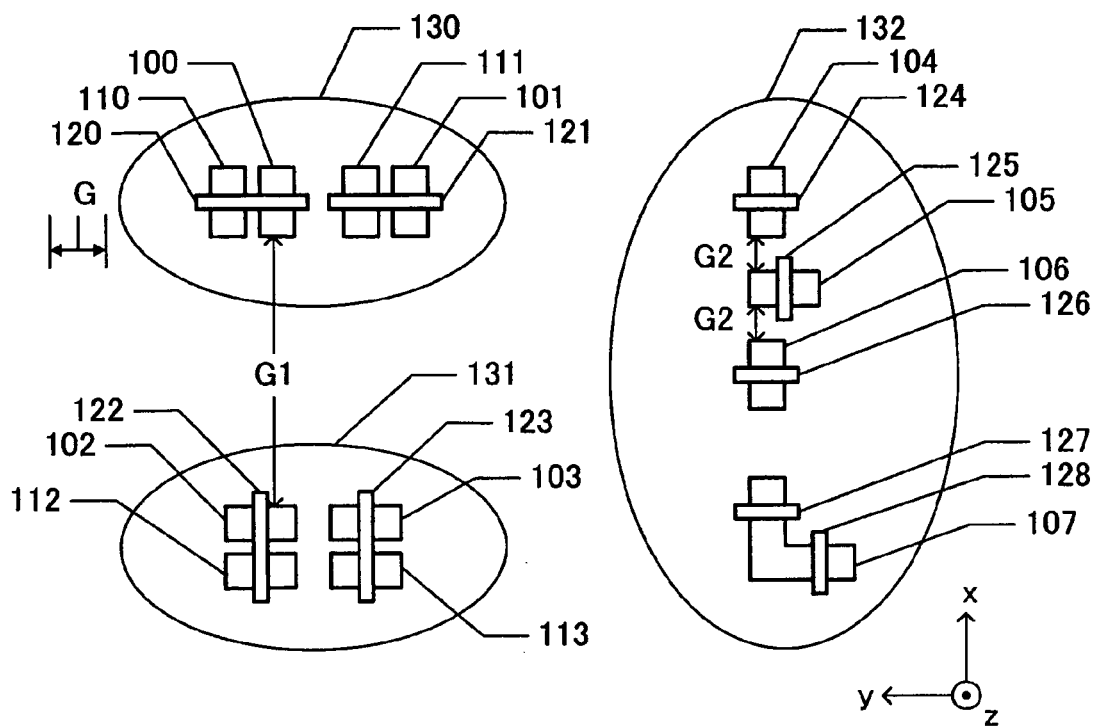
FIG. 14A is a plan view of active regions and gate patterns of a semiconductor device to be manufactured by a manufacture method according to a fourth embodiment.

FIG. 14A is a plan view of active regions and gate patterns defined on a semiconductor substrate. An xyz orthogonal coordinate system is defined by using the semiconductor substrate surface as an xy plane.

NMOS active regions 100 to 107 and PMOS active regions 110 to 113 are disposed on the surface of the semiconductor substrate. All these active regions require pocket implantation. The NMOS active region 100 and PMOS active region 110, and the NMOS active region 101 and PMOS active region 111, are disposed adjacent to each other with a space therebetween in the y-direction. The NMOS active region 102 and PMOS active region 112, and the NMOS active region 103 and PMOS active region 113, are disposed adjacent to each other with a space therebetween in the x-direction.

A gate pattern 120 intersects the NMOS active regions 100 and PMOS active region 110 in the y-direction. A gate pattern 121 intersects the NMOS active regions 101 and PMOS active region 111 in the y-direction. A gate pattern 122 intersects the NMOS active regions 102 and PMOS active region 112 in the x-direction. A gate pattern 123 intersects the NMOS active regions 103 and PMOS active region 113 in the x-direction.

Gate patterns 124 and 126 intersect the NMOS active regions 104 and 106 in the y-direction, respectively. A gate pattern 125 intersects the NMOS active region 105 in the x-direction. Gate patterns 127 and 128 intersect the NMOS active region 107 in the y- and x-directions, respectively.

A layout reference space G is defined. NMOS active regions crossing the gate patterns extending in the y-direction are not disposed at positions remote from the NMOS active regions 100 and 101 crossing the gate patterns extending in the x-direction, by a distance shorter than the layout reference space G. For example, a space G1 from the NMOS active regions 100 and 101 to the NMOS active regions 102 and 103 crossing the gate patterns 122 and 123 extending in the x-direction is longer than the layout reference space G. Similarly, NMOS active regions crossing the gate patterns extending in the y-direction are not disposed at positions remote from the NMOS active regions 102 and 103 crossing the gate patterns 122 and 123 extending in the x-direction, by a distance shorter than the layout reference space G.

The NMOS active regions 104 and 106 crossing the gate patterns 124 and 126 extending in the y-direction are disposed around the NMOS active region 105 crossing the gate pattern 125 extending in the x-direction. A space G2 between the NMOS active regions 104 and 105 and a space G2 between the NMOS active regions 105 and 106 are narrower than the layout reference space G.

Figure 14B:
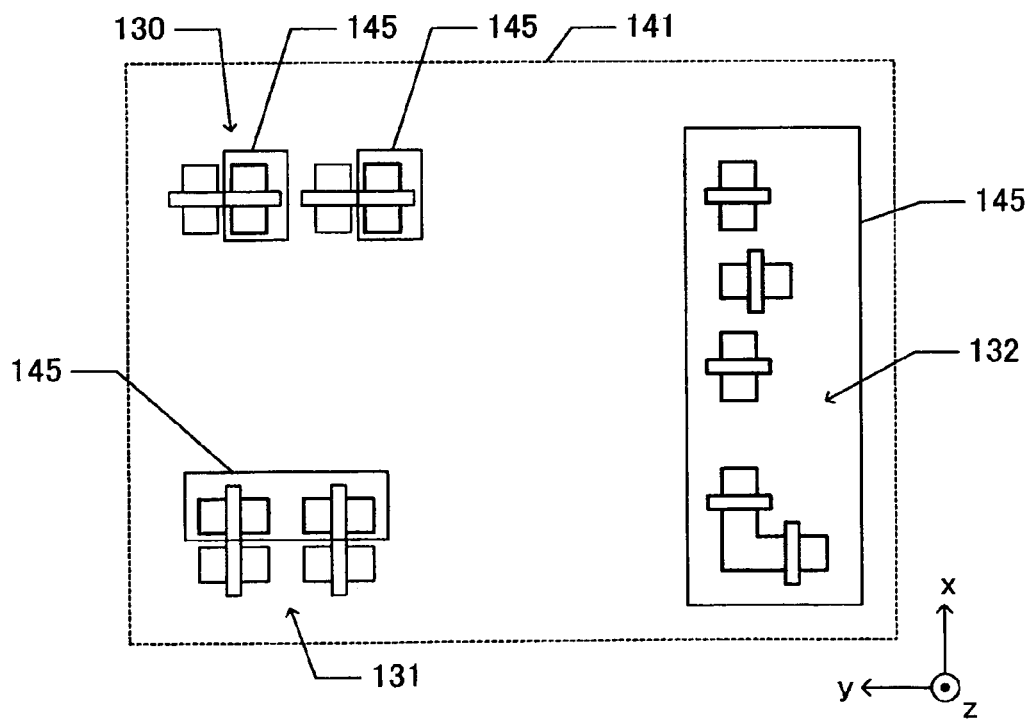
FIG. 14B is a plan view of reticle patterns for NMOS pocket implantation formed by a designer.

FIG. 14B shows patterns to be used for NMOS pocket implantation and to be formed by a designer. Patterns 145 are drawn which are inclusive of the NMOS active regions 100 to 107. A procedure to follow is automatically executed by a computer or the like based on the pattern drawn by the designer shown in FIG. 14B, data representative of directions of gate patterns and data indicating whether any other active region is disposed at a position remote from the NMOS active regions 100 to 107, by a distance shorter than the layout reference space G. The data representative of directions of gate patterns can be acquired from reticle pattern data for forming a reticle pattern. The data indicating whether any other active region is disposed at a position remote from the NMOS active regions 100 to 107 by a distance shorter than the layout reference space G, can be acquired from reticle pattern data for forming an isolation insulating region, reticle pattern data for well implantation and the like.

First, NMOS active regions crossing gate patterns extending in the y-direction are selected. The active regions 100, 101, 104 and 106 shown in FIG. 14A are selected. Of these NMOS active regions, NMOS regions are classified into a first group 130, which regions do not have any other NMOS active region crossing a gate pattern extending in the x-direction and disposed at a position nearer than the position spaced apart by the layout reference space G. In FIG. 14A, the NMOS regions 100 and 101 are classified into the first group 130.

Next, NMOS active regions crossing gate patterns extending in the x-direction are selected. The active regions 102, 103 and 105 shown in FIG. 14A are selected. Of these NMOS active regions, NMOS regions are classified into a second group 131, which regions do not have any other NMOS active region crossing a gate pattern extending in the y-direction and disposed at a position nearer than the position spaced apart by the layout reference space G. In FIG. 14A, the NMOS regions 102 and 103 are classified into the second group 131.

NMOS active regions which cross the gate patterns extending in the y-direction but do not belong to the first group and NMOS active regions which cross the gate patterns extending in the x-direction but do not belong to the second group 131 are classified into a third group 132. In FIG. 14A, the NMOS active regions 104 to 106 are classified into the third group 132. Further, the active region crossing the gate patterns extending in both the x- and y-directions is classified in the third group 132. The NMOS active region 107 shown in FIG. 14A is classified into the third group 132. In FIG. 14A, although each of the first to third groups 130 to 132 contains at least one NMOS active region, the embodiment is also applicable to the case in which any one of the groups does not contain an NMOS active region.

Figure 15A:
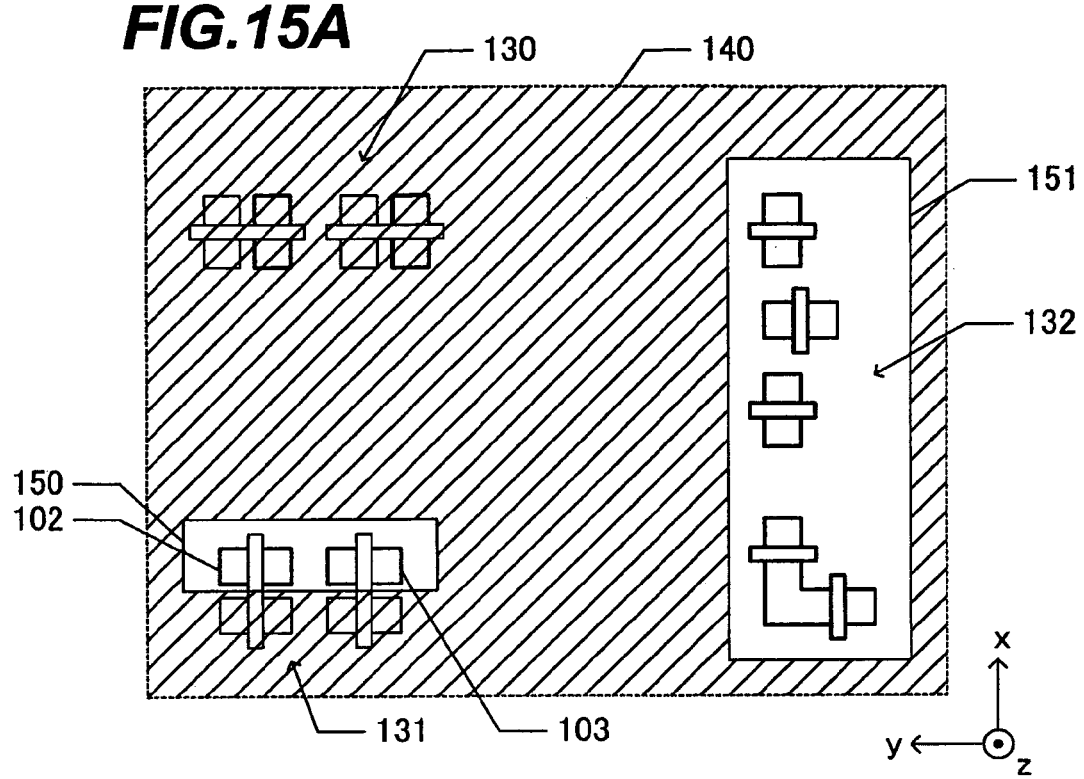
FIGS. 15A and 15B are plan views of a semiconductor device during manufacture by the manufacture method according to the fourth embodiment.

As shown in FIG. 15A, reticle patterns 150 and 151 are generated to form a resist pattern which exposes the NMOS active regions belonging to the second and third groups 131 and 132 and covers the NMOS active regions belonging to the first group 130. These reticle patterns are used for forming the resist pattern 91 shown in FIG. 12A.

Figure 15B:
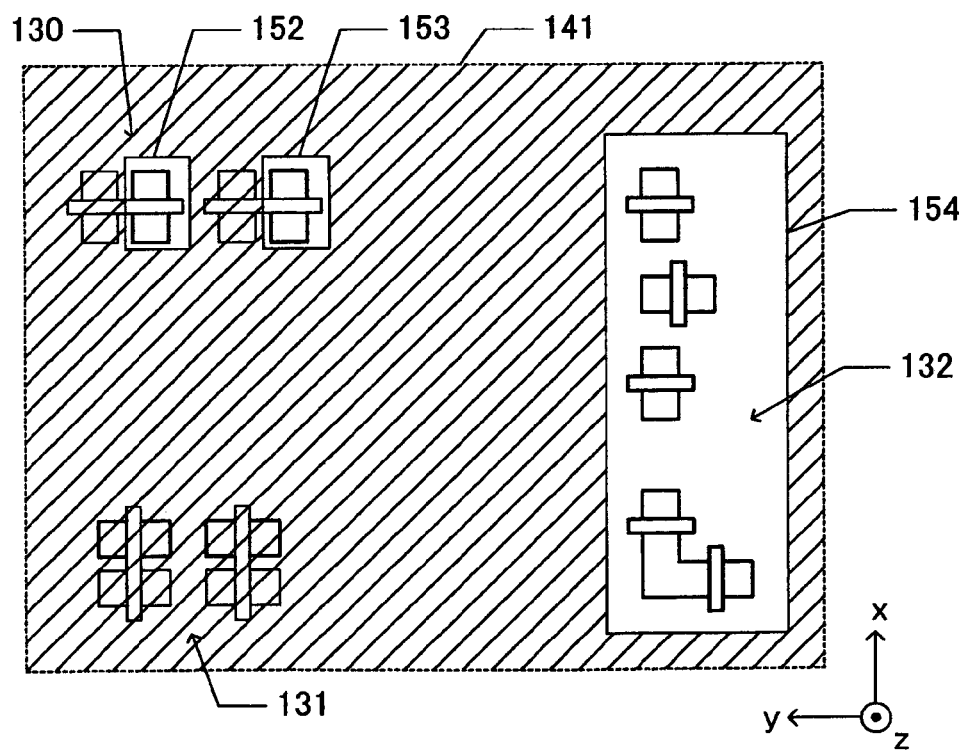

As shown in FIG. 15B, reticle patterns 152 to 154 are generated to form a resist pattern which exposes the NMOS active regions belonging to the first and third groups 130 and 132 and covers the NMOS active regions belonging to the second group 131. These reticle patterns are used for forming the resist pattern 90 shown in FIG. 11A.

As described above, by defining the layout reference space G, reticle patterns of two reticles can be generated automatically. By manufacturing a semiconductor device by using such reticle patterns, pocket implantation can be performed under the same condition for the NMOS active regions belonging to the third group 132. It is therefore possible to suppress variations in the characteristics of NMOS transistors in these active regions.

Even if a PMOS active region is disposed near the NMOS active regions belonging to the first and second groups 130 and 131, pocket implantation is possible for these NMOS active regions under the condition that the NMOS active regions are not shaded by resist patterns.

In order to automatically generate reticle patterns of two reticles shown in FIGS. 15A and 15B, a designer just has to draw pattern data corresponding to the NMOS active regions shown in FIG. 14B for which pocket implantation is to be performed. A load on the designer can therefore be reduced.

Figure 16:
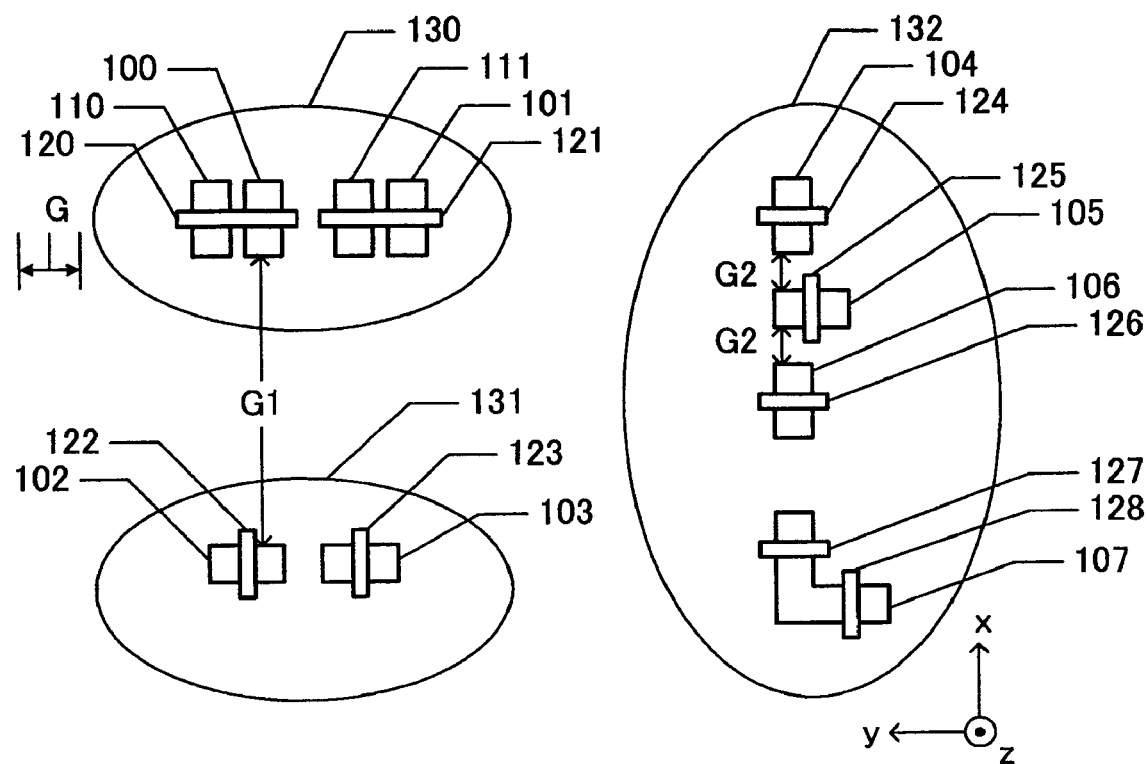
FIG. 16 is a plan view of active regions and gate patterns of a semiconductor device to be manufactured by a manufacture method according to a fifth embodiment.

Next, with reference to FIGS. 16 to 17B, description will be made on a method of forming reticle patterns according to the fifth embodiment. In the fourth embodiment, the PMOS active regions 112 and 113 are disposed near the NMOS active regions 102 and 103 belonging to the second group 131, for example, at positions remote from the NMOS active regions 102 and 103 by a distance between an NMOS and PMOS active regions based on a design rule. In the fifth embodiment, PMOS active regions are not disposed near the NMOS active regions 102 and 103. The other structures are the same as those of the fourth embodiment.

Figure 17A:
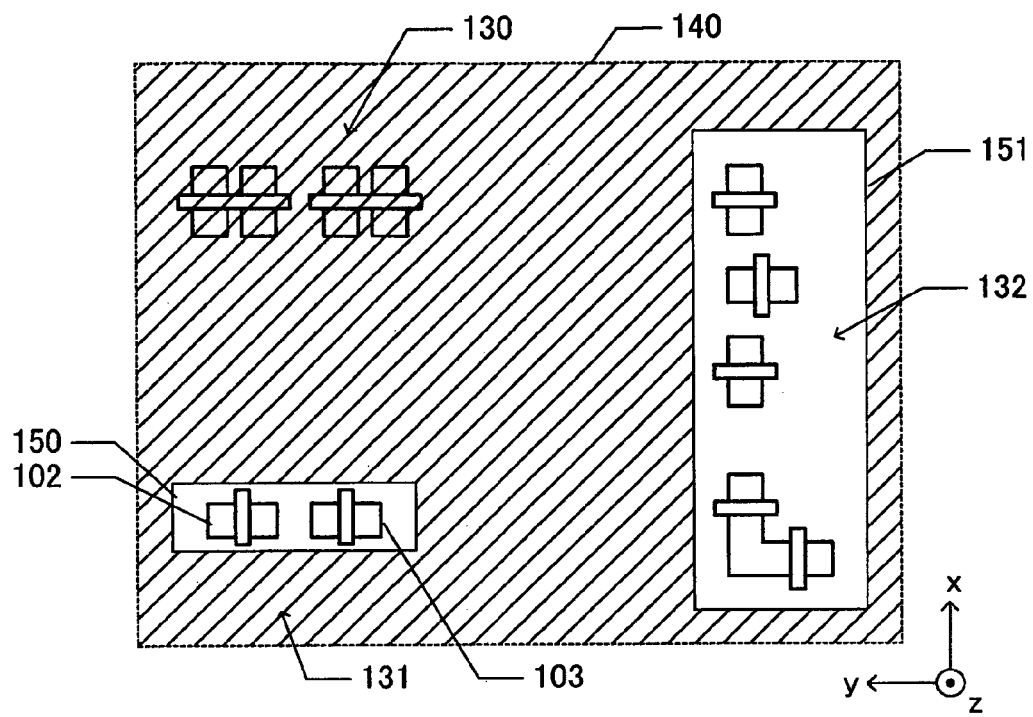
FIGS. 17A and 17B are plan views of a semiconductor device during manufacture by the manufacture method according to the fifth embodiment.
Figure 17B:
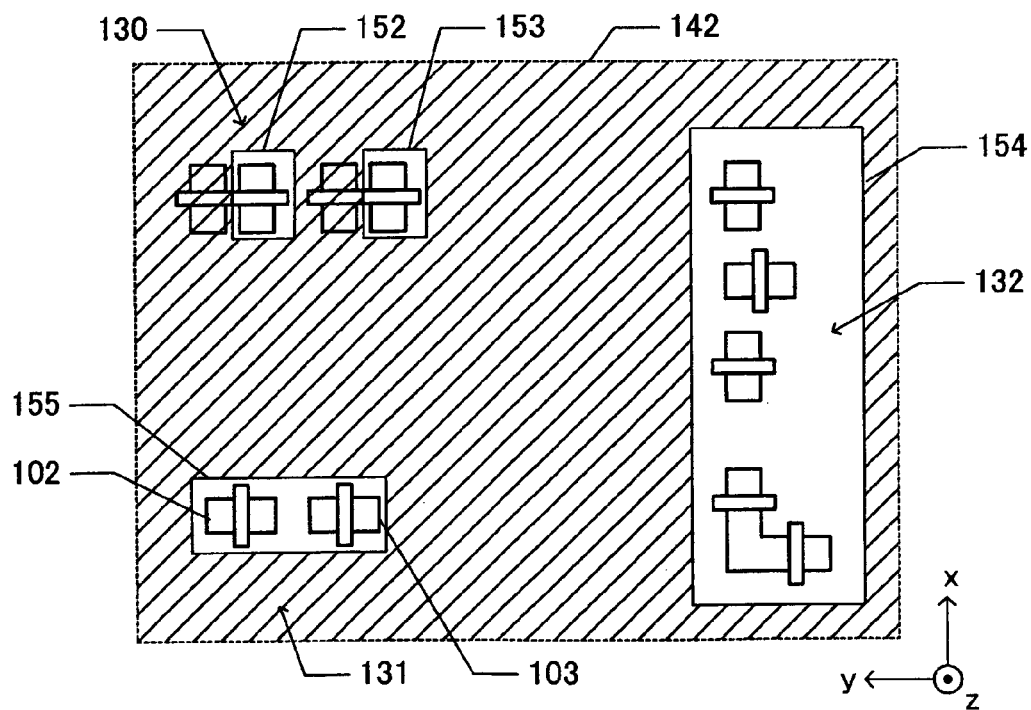

Patterns of a reticle shown in FIG. 17A are identical to that shown in FIG. 15A. In the fifth embodiment, when the patterns of the reticle of the fourth embodiment shown in FIG. 15B are formed, in addition to the reticle patterns 152 to 154, a reticle pattern 155 is formed to expose the NMOS active regions 102 and 103 belonging to the second group 131.

PMOS active regions are not disposed near the NMOS regions 102 and 103 belonging to the second group 131. Therefore, the edge of a resist pattern to be formed by the reticle pattern 155 can be set sufficiently remote from the edges of the NMOS active regions 102 and 103. Therefore, even if ion implantation is performed at azimuth angles of 0° and 180°, it is possible to find the condition that the NMOS active regions 102 and 103 are not shaded by the resist pattern.

By using the reticle patterns formed by the fifth embodiment method, pocket implantation under the same condition as that for the NMOS active regions belonging to the third group 132 can be performed for the NMOS active regions belonging to the second group 131. It is therefore possible to suppress variations in the characteristics of NMOS transistors.

Figure 18A:
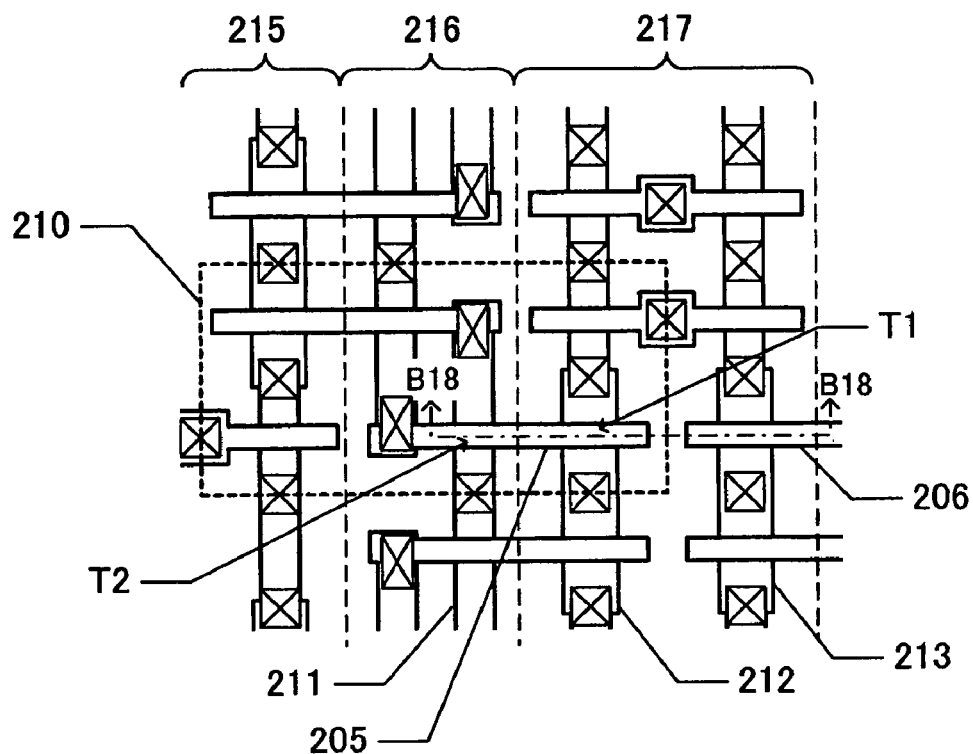
FIG. 18A is a plan view of an SRAM.
Figure 18B:
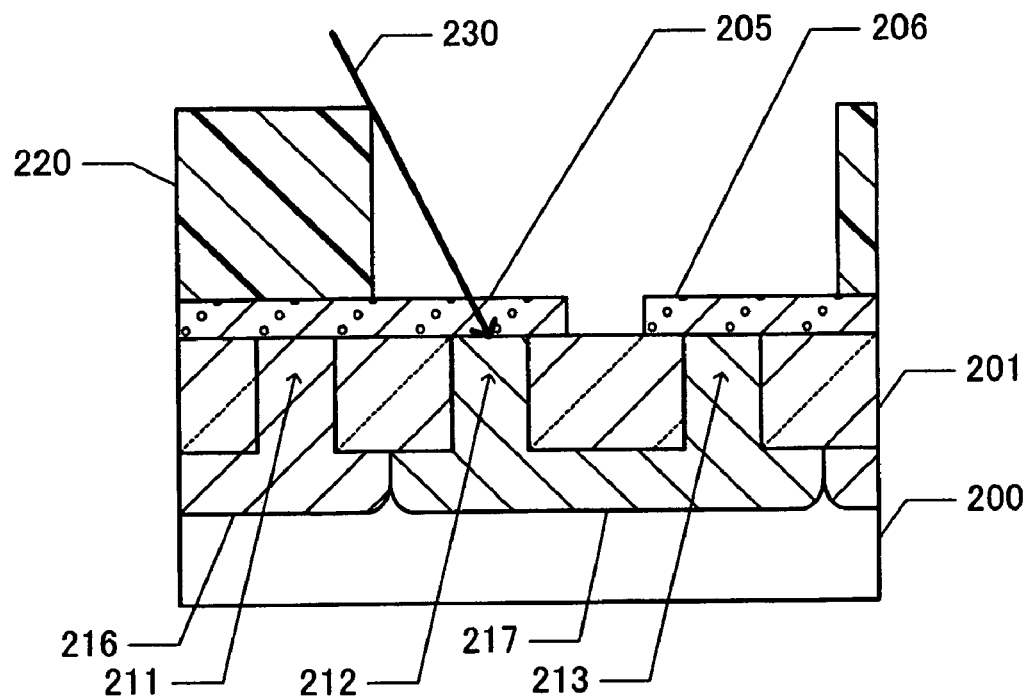
FIG. 18B is a cross sectional view taken along one-dot chain line B18-B18 shown in FIG. 18A.

In the above embodiments, although pocket implantation for NMOS active regions has been described illustratively, it is obvious that the embodiments are applicable also to pocket implantation for PMOS active regions. The ion implantation method of the above embodiments is not limited to manufacture of SRAM memory cells shown in FIGS. 18A and 18B, but is also applicable to manufacture of other semiconductor devices such as CAM cells disclosed in JP-A-2005-340269. In the above embodiments, although the method of manufacturing a semiconductor device having a common gate pattern intersecting both the NMOS active region and adjacent PMOS active region has been described illustratively, it is obvious that the embodiments are also applicable to the case in which a gate pattern intersecting the NMOS active region does not intersect the adjacent PMOS active region.

The present invention has been described in connection with the preferred embodiments. The invention is not limited only to the above embodiments. It will be apparent to those skilled in the art that other various modifications, improvements, combinations, and the like can be made.

What are claimed are:

1. A method of manufacturing a semiconductor device comprising steps of:
   (a) forming an isolation insulating film in a surface layer of a semiconductor substrate to form a first active region of a first conductivity type and an opposite conductivity type active region of a second conductivity type, the first active region and the opposite conductivity type active region being adjacent to each other across the isolation insulating film;
   (b) covering the opposite conductivity type active region with a first resist pattern, with an edge of the first resist pattern being disposed on the isolation insulating film between the first active region and the opposite conductivity type active region; and
   (c) implanting impurity ions using an ion beam into a surface layer of the first active region by using the first resist pattern as a mask, a tilt angle of the ion beam being larger than a first angle between a first virtual plane and a second virtual plane, the first virtual plane including an edge of the first active region nearest to the first resist pattern and being perpendicular to a surface of the semiconductor substrate, the second virtual plane including the edge of the first active region nearest to the first resist pattern and including an uppermost edge of a sidewall of the first resist pattern on a side of the first active region, and an azimuth angle of the ion beam being selected in such a manner that ions passing through the uppermost edge of the sidewall of the first resist pattern on the side of the first active region are incident upon the edge of the first active region on the side of the first resist pattern, or incident upon the isolation insulating film between the first active region and the first resist pattern but not incident upon the first active region.

2. The method of manufacturing the semiconductor device according to claim 1, further comprising between the steps (a) and (b) a step of:
   (d) forming a first gate pattern intersecting the first active region from an edge facing the opposite conductivity type active region to an opposite edge, wherein in the step (c) impurities of the first conductivity type are implanted by using the first gate pattern as a mask to form pocket regions, and further comprising a step of, after the first gate pattern is formed:
   (e) implanting impurities of the second conductivity type by using the first gate pattern as a mask to form source/drain regions.

3. The method of manufacturing the semiconductor device according to claim 2, further comprising a step of forming sidewall spacers on sidewalls of the first gate pattern, wherein the step (d) is performed before or after the sidewall spacers are formed and the step (e) is performed before or after the sidewall spacers are formed.

4. The method of manufacturing the semiconductor device according to claim 2, wherein by defining the azimuth angle of a direction as 0°, the direction being perpendicular to a direction in which the first gate pattern intersects the first active region, ion implantation in the step (c) is performed at least at one azimuth angle in a range of −45° to +45° and in a range of 135° to 225°.

5. The method of manufacturing the semiconductor device according to claim 4, wherein:

in the step (a), second and third active regions of the first conductivity type are formed in addition to the first active region and the opposite conductivity type active region;

in the step (d), a second gate pattern is formed intersecting the second active region in a direction perpendicular to the direction in which the first gate pattern intersects the first active region, and a third gate pattern is formed intersecting the third active region in a direction in which the first gate pattern intersects the first active region; and the semiconductor device manufacture method further comprises a step of:

(f) performing ion implantation at least at one azimuth angle in a range of 45° to 135° and in a range of 225° to 315° for the second and third active region during the first active region and the opposite conductivity type active region are covered with a second resist pattern.

6. The method of manufacturing the semiconductor device according to claim 5, wherein the second and third active regions constitute a single continuous region.

7. The method of manufacturing the semiconductor device according to claim 5, wherein:

in the step (a), a fourth active region of the first conductivity type is formed in addition to the first to third active regions and the opposite conductivity type active region;

in the step (d), a fourth gate pattern is formed which intersects the fourth active region in a direction perpendicular to the direction in which the first gate pattern intersects the first active region; and in the step (f), at the same time when ions are implanted into the second and third active regions, ions are implanted into the fourth active region.

8. A method of generating reticle patterns of a reticle for forming a resist pattern to be used for forming pocket regions of a first conductivity type transistor in a substrate with the first conductivity transistor and a second conductivity transistor being disposed, the method comprising steps of:

(A) classifying a plurality of active regions, in which the first conductivity type transistors are disposed, into first, second and third groups, a gate pattern intersecting the active region of the first group in a first direction, no active region that a gate pattern intersects in a second direction perpendicular to the first direction being disposed at a position remote from the active region of the first group by a distance shorter than a layout standard distance based on a design rule, a gate pattern intersecting the active region of the second group in the second direction, no active region that a gate pattern intersects in the first direction being disposed at a position remote from the active region of the second group by a distance shorter than the layout standard distance, the active region of the third group intersecting a gate pattern extending in the first direction but not belonging to the first group or intersecting a gate pattern extending the second direction but not belonging to the second group;

(B) generating a first reticle pattern for forming a resist pattern which covers the active region belonging to the first group and exposing the active regions belonging to the second and third groups; and (C) generating a second reticle for forming a resist pattern which covers the active region belonging to the second group and exposing the active regions belonging to the first and third groups.

9. The method of generating reticle patterns of the reticle according to claim 8, wherein in the step (A), active regions intersecting both gate patterns extending in the second direction and gate patterns extending in the first direction are classified into the third group.

10. The method of generating reticle patterns of the reticle according to claim 8, wherein an active region for the second conductivity type transistor is disposed such that a distance between the active region of the first group and the active region for the second conductivity type transistor is shorter than a pn standard space, and a distance between each of the active regions of the second group and a nearest active region for the second conductivity type transistor is longer than the pn standard space.

11. The method of generating reticle patterns of the reticle according to claim 8, wherein an active region for the second conductivity type transistor is disposed such that a distance between the active region of the first group and the active region for the second conductivity type transistor is shorter than a pn standard space, another active region for another second conductivity type transistor is disposed such that a distance between the active region of the second group and the active region for said another second conductivity type transistor is shorter than a pn standard space.

* * * * *